United States Patent
Ellis et al.

(10) Patent No.: US 12,463,533 B2
(45) Date of Patent: Nov. 4, 2025

(54) BI-DIRECTIONAL SYNCHRONOUS BOOTSTRAPPING

(71) Applicant: THE REGENTS OF THE UNIVERSITY OF CALIFORNIA, Oakland, CA (US)

(72) Inventors: Nathan Miles Ellis, Emeryville, CA (US); Robert C. N. Pilawa-Podgurski, Alameda, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 102 days.

(21) Appl. No.: 18/439,364

(22) Filed: Feb. 12, 2024

(65) Prior Publication Data
US 2024/0195295 A1 Jun. 13, 2024

Related U.S. Application Data

(63) Continuation of application No. PCT/US2022/075413, filed on Aug. 24, 2022.
(Continued)

(51) Int. Cl.
*H02M 3/158* (2006.01)
*H02M 1/00* (2006.01)
(Continued)

(52) U.S. Cl.
CPC ........... *H02M 3/07* (2013.01); *H02M 1/0045* (2021.05); *H03K 17/6871* (2013.01); *H03K 2217/0063* (2013.01); *H03K 2217/0072* (2013.01)

(58) Field of Classification Search
CPC ...... H02M 3/07; H02M 3/158; H02M 1/0045; H02M 1/007; H02M 1/08; H02M 1/38;
(Continued)

(56) References Cited

U.S. PATENT DOCUMENTS

| 8,000,117 B2 | 8/2011 | Petricek |
| 8,300,429 B2 | 10/2012 | Orr |

(Continued)

FOREIGN PATENT DOCUMENTS

| WO | 2023028526 A1 | 3/2023 |

OTHER PUBLICATIONS

Lei, Yutian, et al., "A 2-kw single-phase seven-level flying capacitor multilevel inverter with an active energy buffer," IEEE Transactions on Power Electronics, vol. 32, No. 11, 2017, pp. 8570-8581.
(Continued)

*Primary Examiner* — Sibin Chen
(74) *Attorney, Agent, or Firm* — O'BANION & RITCHEY LLP; John P. O'Banion

(57) ABSTRACT

An apparatus and method for delivering power to the gate-drivers used in switching power conversion devices. In a bootstrapping network gate drivers are cascaded between a high-side and a low-side. Each gate driver controls a bidirectional active switch along a synchronous bootstrapping power path. The bootstrapping power path contains at least two bias voltage supplies to provide for bidirectional charge flow to the gate drivers, so that balanced delivery of charge can be maintained. A bias voltage supply on the high-side is line-referenced and provides charge to the bootstrapping network in a downward flowing direction.

18 Claims, 27 Drawing Sheets

Related U.S. Application Data

(60) Provisional application No. 63/237,086, filed on Aug. 25, 2021.

(51) Int. Cl.
*H02M 3/07* (2006.01)
*H03K 17/687* (2006.01)

(58) Field of Classification Search
CPC ....... H03K 17/6871; H03K 2217/0063; H03K 2217/0072
See application file for complete search history.

(56) References Cited

U.S. PATENT DOCUMENTS

| | | | |
|---|---|---|---|
| 12,155,174 B2* | 11/2024 | Yawata | H01S 5/0428 |
| 2014/0217959 A1 | 8/2014 | Chen | |
| 2016/0224175 A1* | 8/2016 | Moon | G06F 3/0412 |
| 2018/0159427 A1 | 6/2018 | Giuliano | |
| 2019/0028094 A1* | 1/2019 | Reusch | H02M 1/088 |
| 2020/0076415 A1* | 3/2020 | Lee | H03K 17/08122 |

OTHER PUBLICATIONS

Ye, Zichao, et al., "A resonant switched capacitor based 4-to-1 bus converter achieving 2180 W/in 3 power density and 98.9% peak efficiency", IEEE Applied Power Electronics Conference and Exposition (APEC), Mar. 2018, pp. 121-126.
Ellis, Nathan Miles, et al., "A Resonant 1: 5 Cockcroft-Walton Converter Utilizing GaN FET Switches with N-Phase and Split-Phase Clocking," in 2020 IEEE Applied Power Electronics Conference and Exposition (APEC), 2020, pp. 19-25.
Ye, Zichao, et al.,, "A 48-to-12 v cascaded resonant switched-capacitor converter for data centers with 99% peak efficiency and 2500 w/in 3 power density," in 2019 IEEE Applied Power Electronics Conference and Exposition (APEC), 2019, pp. 13-18.
Ellis, Nathan Miles, et al., "Reducing cross switching loss in a gan-based resonant cockcroft-walton converter using resonant charge redistribution," in 2020 IEEE Energy Conversion Congress and Exposition, 2020, pp. 158-164.
Ellis, Nathan Miles, et al., "A Resonant Gate Driver with Variable Gain and a Capacitively Decoupled High-Side GaN-FET," in 2020 IEEE Energy Conversion Congress and Exposition (ECCE), IEEE Energy Conversion Congress and Exposition, 2020, pp. 3793-3797.
Pilawa-Podgurski, Robert C.N., et al., "Very-high-frequency resonant boost converters," IEEE Transactions on Power Electronics, vol. 24, No. 6, 2009, pp. 1654-1665.
Perreault, David J., et al., "Opportunities and challenges in very high frequency power conversion," Twenty-Fourth Annual IEEE Applied Power Electronics Conference and Exposition, 2009, pp. 1-14.
Analog Devices, Dual-Channel Isolators with Integrated DC-to-DC Converters, (accessed Apr. 1, 2021), https://www.analog.com/.
Meynard, Thierry A., "Multi-level conversion: high voltage choppers and voltage-source inverters," 23rd Annual IEEE Power Electronics Specialists Conference, 1992, pp. 397-403.
Stillwell, Andrew, "Active voltage balancing in flying capacitor multi-level converters with valley current detection and constant effective duty cycle control", IEEE Transactions on Power Electronics, vol. 34, No. 11, 2019, pp. 11 429-11 441.
Pallo, Nathan et al., "A 10-level flying capacitor multi-level dual-interleaved power module for scalable and power-dense electric drives", IEEE Applied Power Electronics Conference and Exposition, 2020, pp. 893-898.
Klumpner, Christian "A cost-effective solution to power the gate drivers of multilevel inverters using the bootstrap power supply technique," Twenty-Fourth Annual IEEE Applied Power Electronics Conference and Exposition, 2009, pp. 1773-1779.
Ye, Zichao, et al., "A power supply circuit for gate driver of gan-based flying capacitor multi-level converters", IEEE 4th Workshop on Wide Bandgap Power Devices and Applications, 2016, pp. 53-58.
Biswas, S "Gan based switched capacitor threelevel buck converter with cascaded synchronous bootstrap gate drive scheme", IEEE Energy Conversion Congress and Exposition, 2018, pp. 3490-3496.
Ye, Zichao, et al., "Improved bootstrap methods for powering floating gate drivers of flying capacitor multilevel converters and hybrid switched-capacitor converters", IEEE Transactions on Power Electronics, vol. 35, No. 6, 2019, pp. 5965-5977.
Efficient Power Conversion, EPC2108 Datasheet (Figure 14), (accessed Apr. 1, 2021), https://epc-co.com/.
Texas Instruments, LMG1205 80V, 1.2A to 5A, Half Bridge GaN Driver with Integrated Bootstrap Diode, (accessed Jun. 22, 2021), https://www.ti.com/.
Choi, Minho, et al. "18.6 A 92.8%-peak-efficiency 60A 48V-to-1V 3-level half-bridge DC-DC converter with balanced voltage on a flying capacitor", IEEE International Solid-State Circuits Conference, Feb. 2020, pp. 296-298.
Assem, Pourya, et al. "Quad gate-driver controller with start-up and shutdown for cascaded resonant switched-capacitor converter," IEEE Custom Integrated Circuits Conference, 2021, pp. 1-2.
EPC Efficient Power Conversion, EPC2152 80V, 15A ePowerTM Stage, Preliminary Datasheet, revision 2.0, (accessed Jun. 23, 2021), https://www.epc-co.com.
EPC2108_datasheet, EPC2108 "Enhancement-Mode GaN Power Transistor Half-Bridge with Integrated Synchronous Bootstrap", 2019, pp. 1-10.

* cited by examiner

BI-DIRECTIONAL SYNCHRONOUS BOOTSTRAPPING

CROSS-REFERENCE TO RELATED APPLICATIONS

This application claims priority to, and is a 35 U.S.C. § 111(a) continuation of, PCT international application number PCT/US2022/075413 filed on Aug. 24, 2022, incorporated herein by reference in its entirety, which claims priority to, and the benefit of, U.S. provisional patent application Ser. No. 63/237,086 filed on Aug. 25, 2021, incorporated herein by reference in its entirety. Priority is claimed to each of the foregoing applications.

The above-referenced PCT international application was published as PCT International Publication No. WO 2023/028526 A1 on Mar. 2, 2023, which publication is incorporated herein by reference in its entirety.

STATEMENT REGARDING FEDERALLY SPONSORED RESEARCH OR DEVELOPMENT

Not Applicable

NOTICE OF MATERIAL SUBJECT TO COPYRIGHT PROTECTION

A portion of the material in this patent document may be subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technical Field

The technology of this disclosure pertains generally to electrical power converters, and more particularly to delivering power to the gate-drivers utilized in switching power converters.

2. Background Discussion

Numerous power conversion systems rely on switching of cascaded power transistors (e.g., FETs, MOSFETs, etc.) on an output power line. The control of these power transistors is performed by cascaded gate drivers, each having an output to control switching of a power transistor. Bias power is often supplied to the gate drives in this supply by bootstrapping, such as with a series of diodes, or low-dropout voltage regulators. However, the operation of these cascaded gate drivers suffer from various shortcoming and inefficiencies.

Accordingly, the present disclosure overcomes many of the issues and inefficiencies in present-day cascaded gate drivers and provides additional benefits.

BRIEF SUMMARY

Circuitry is described for delivering power to the gate-drivers used in switching power converters. Instead of relying on isolated magnetic-based approaches, the technology described herein uses direct-coupling between the gate-drive circuitry of adjacent power switches, thereby categorizing it broadly with the term "bootstrapping".

More specifically, rather than utilizing diodes to perform this energy coupling, as per conventional systems, diodes are replaced with fully active switches which are controlled at precisely appropriate times, as dictated by the switching activity of the adjacent primary power switches (on a cascaded power output section), and thus the bootstrapping is referred to herein as "synchronous". This synchronous bootstrapping operation is an important element of the technology as it feeds energy into a coupled gate-drive power delivery network from multiple points in a coupled chain, which capitalizes on the ability of synchronous bootstrapping ability to conduct charge in both directions (in ascending and/or descending voltage directions), which is distinct from conventional diode-based approaches to driving the power converter in which energy must flow in an ascending voltage direction.

Moreover, the approach described herein uses the existing control signal for the adjacent primary power switch to generate an appropriate synchronous bootstrapping control signal locally, thereby eliminating the need for additional control signals and associated level-shifting. As such, the described approach does not add to the control complexity or clock generation requirements of the power converter.

The approach described herein has been validated by creating a hardware prototype that demonstrates power being introduced into a synchronous bootstrapping chain through the gate-driver biased at the lowest potential, as is typical, but also delivered through the gate-driver biased at the highest potential (among other possible injection sites). The present disclosure demonstrates that the power delivered to the highest potential driver can effectively propagate downwards through the chain, offering an alternative power delivery path. This capability acts to greatly decrease the path impedance for power delivery, improving gate-drive power delivery efficiency significantly. This technique is amenable to complete integration into future gate-driver IC solutions.

Further aspects of the technology described herein will be brought out in the following portions of the specification, wherein the detailed description is for the purpose of fully disclosing preferred embodiments of the technology without placing limitations thereon.

BRIEF DESCRIPTION OF THE DRAWINGS

The technology described herein will be more fully understood by reference to the following drawings which are for illustrative purposes only.

DETAILED DESCRIPTION

1. Introduction to Power Conversion

In the quest towards improved power density, efficiency and cost, industries continue to be receptive to improvements made in micro-assembly and co-packaging, in addition to monolithic solutions, with electronic power modules gaining significant market share in recent years. Thus, there is a strong motivation toward improving converter subsystems.

One essential, yet often trivialized aspect of power converter design is the power delivery scheme for the gate-drivers contained therein. While this circuitry is expected to leave a minimal footprint, improvements in this area have not kept pace with the rapidly developing power converter landscape in which higher order topologies eschew simplicity for dramatic performance improvements; advanced control schemes and assistive circuitry minimize parasitic effects; and advanced semiconductor devices, such as Gallium Nitride, consume significantly less area for the same switch conductivity while simultaneously boasting reduced parasitics. Subsequently, switching frequencies have been increased, resulting in the ordinarily dominant volume of passive components being reducing considerably.

Conventional gate-driver power delivery has historically employed isolated voltage supplies when dealing with topologies with complexity beyond the standard half-bridge structure. However, this approach tends to be expensive while consuming considerable converter volume, especially for converters with a high switch count, such as the Flying Capacitor Multi-Level (FCML) converter. In response, in recent years there has been a push toward developing non-isolated gate-driver power delivery techniques with the promise of significantly increased overall converter density.

Figure 1:
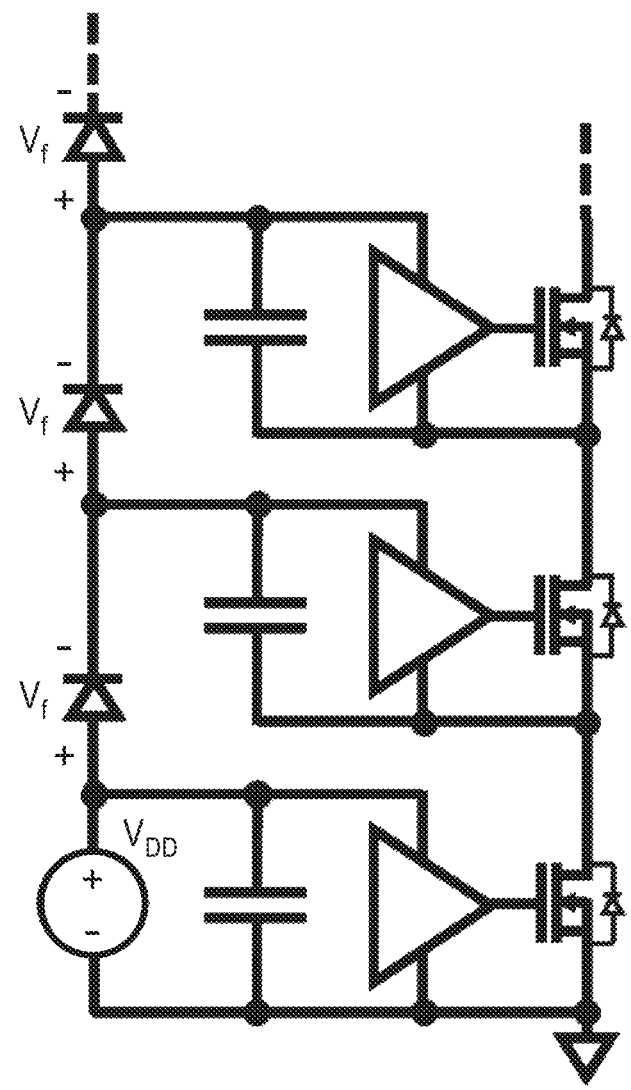
FIG. 1 is a schematic of a straight-forward cascaded boot-strapping scheme using diodes between each of the cascaded gate drivers.
Figure 2:
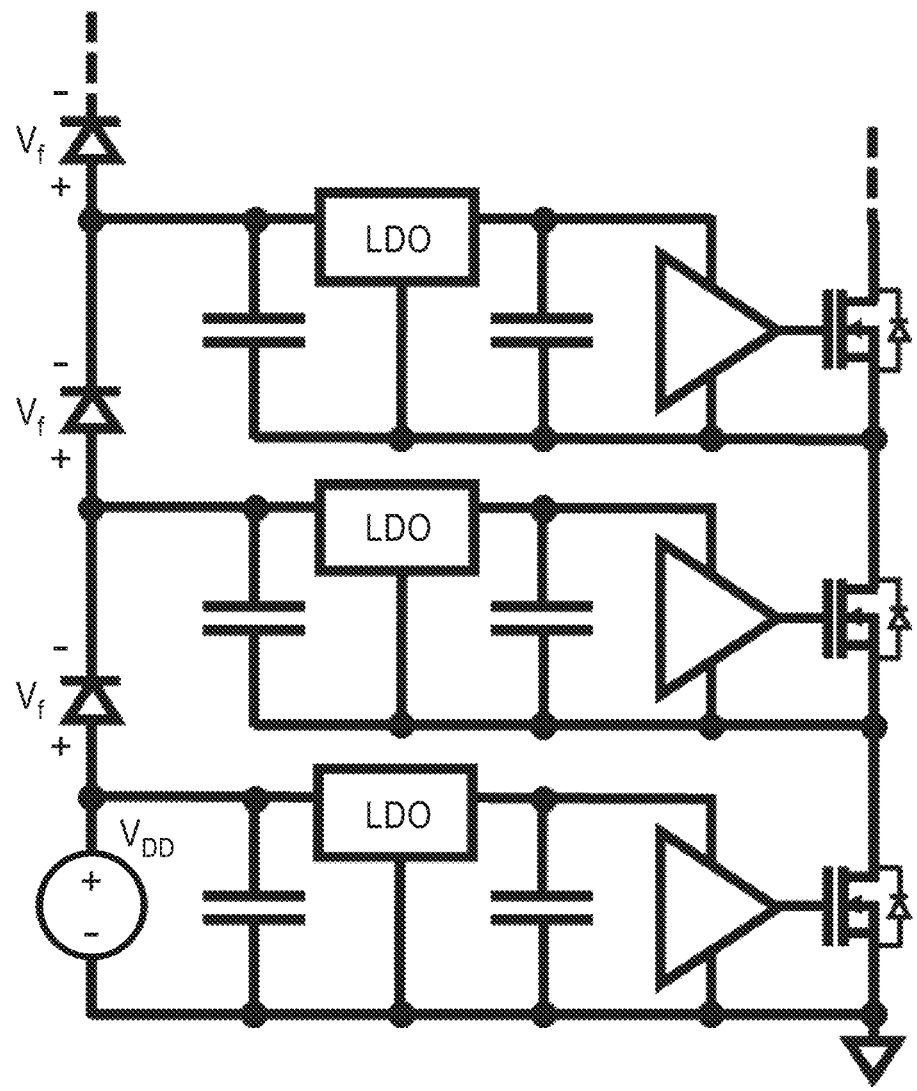
FIG. 2 is a schematic of cascaded bootstrap with Linear or Low-Drop-Out (LDO) regulation in each of the cascaded gate drivers.

FIG. 1 and FIG. 2 depict the use of boot-strap diodes in a converter. In FIG. 1 is shown a straight-forward cascaded boot-strapping scheme using diodes, between each of the stacked stages extending from a voltage source $V_{DD}$. Each stage of which is shown with a bypass capacitor, driver and switching device (e.g., Field-Effect Transistor (FET), IGBT, BJT, HEMT, vacuum tube). The gate driver should have appropriate clocking control inputs as per the specific power converter control scheme. However, this arrangement suffers from accumulating voltage droop due to repeated diode forward voltage drops $V_f$.

The commonly used bootstrap diode offers a simple and elegant solution for half-bridge structures, with many commercial products even integrating this element on-chip. However, when applied over an increased number of switches, the repeated diode drops lead to a significant decrease in voltage provided to each subsequent gate driver. Although voltage recovery schemes have been proposed which leverage a finite dead-time duration, this approach is both load and timing dependent; while only being applicable to switches that are subjected to reverse conduction as part of normal converter operation. In GaN-based converters where tight supply tolerances are required, this approach may be considered infeasible in practice.

In FIG. 2 is shown a cascaded bootstrap with Linear or Low Drop Out (LDO) regulation, in which the local regulation ensures that the correct voltage is presented to each gate driver, albeit with poor efficiency. In this circuit the diode for each stacked stage extends from the voltage source, and each stage is shown with an LDO having bypass capacitors at the input and output coupled to a driver which controls a power transistor (e.g., FET, MOSFET, or similar switch).

The above circuit attempts to overcome the accumulating voltage droop by increasing the ground-referenced supply voltage ($V_{DD}$) and introducing local regulation within each gate driver. Recognizing that this approach leads to significant Low Drop Out (LDO)-incurred inefficiency, others have proposed splitting the power delivery path using gate driven charge pumps, thus reducing path impedance and leading to reduced LDO losses. While both of these approaches offer compelling results, they still rely on lossy diodes and ultimately require local regulation in many applications.

Figure 3:
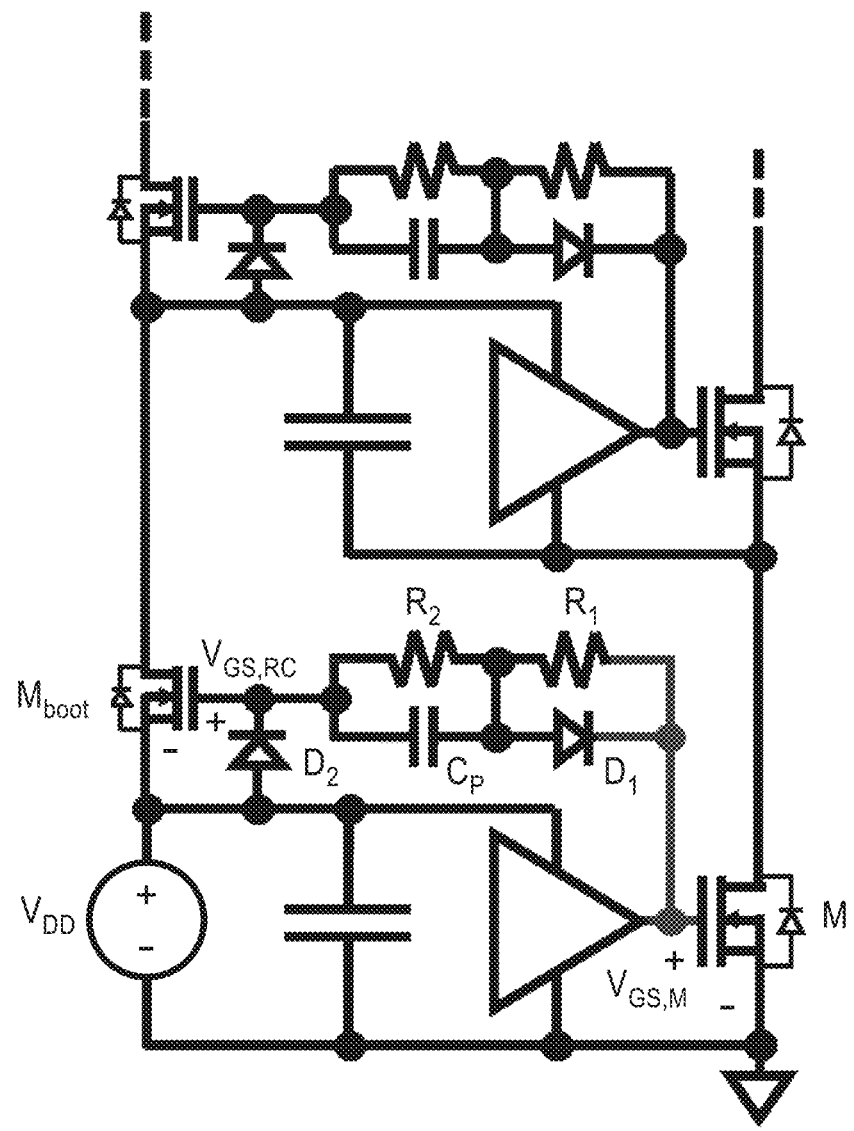
FIG. 3 is a schematic of gate-driven synchronous bootstrap circuit using an RC delay network to provide an appropriate gate drive signal to a diode-replacing boot-strap FET.
Figure 4:
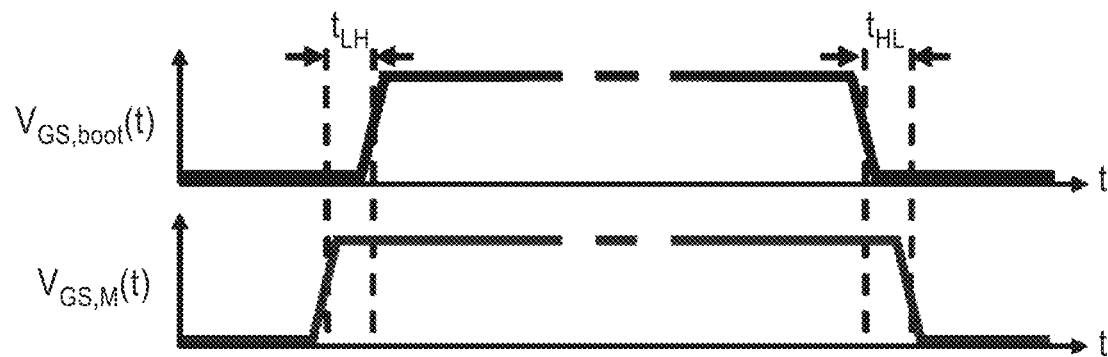
FIG. 4 is a waveform plot of ideal waveforms for the synchronous bootstrap circuit.
Figure 5:
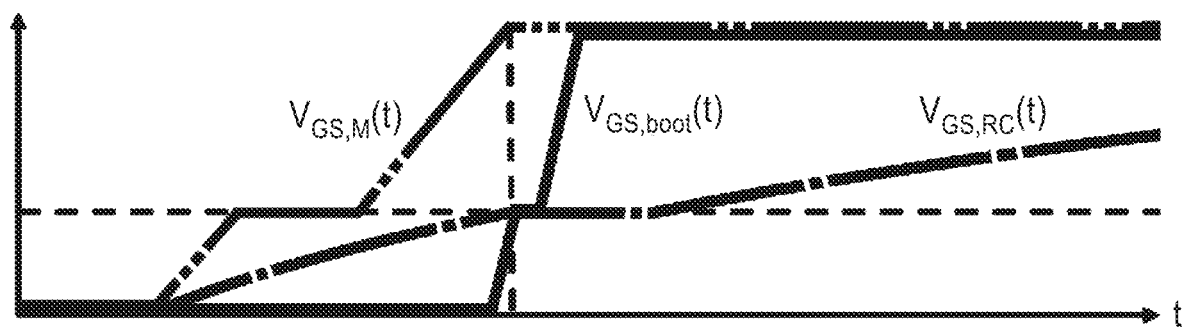
FIG. 5 is a waveform plot occurring at the turn-on of primary switching device M (waveform VGS,M(t)), showing the resulting waveform from the synchronous bootstrap circuit of FIG. 3 (waveform VGS,RC(t)), and showing an ideal turn on switching waveform according to at least one embodiment of the present disclosure (waveform VGS,boot (t)).

FIG. 3 through FIG. 5 illustrate a form of RC-delayed synchronous bootstrapping which removes diode drops toward increasing efficiency and feasible switching frequency; although the bootstrap conduction time is still limited by the RC delay.

In FIG. 3 is shown a gate-driven synchronous boot-strap circuit using an RC delay network to provide an appropriate gate drive signal to a diode-replacing boot-strap FET ($M_{boot}$). As the gating signal $V_{GS,M}$ goes high, primary switching device M turns on, while components R1 and CP act to deliver an RC-delayed level-shifted gate drive signal to $M_{boot}$ (See FIG. 25, TLH). When the gating signal $V_{GS,M}$ goes low, components CP and D1 act to quickly turn $M_{boot}$ off with minimal delay (See FIG. 25 THL). Components D2 and R2 serve to ensure an appropriate bias voltage is stored on CP.

FIG. 4 depicts ($V_{GS,boot}$ (t)) and ($V_{GS,M}$ (t)) ideal waveforms for the synchronous bootstrap circuit of FIG. 3, in which $M_{boot}$ must only be turned on within the conduction period of the primary FET, M. Time durations $t_{LH}$ and $t_{HL}$ must be substantial enough to avoid shoot-through currents, but sufficiently short so as to maximize conduction through $M_{boot}$, reducing voltage droop in a cascaded array of gate drivers.

Figure 22:
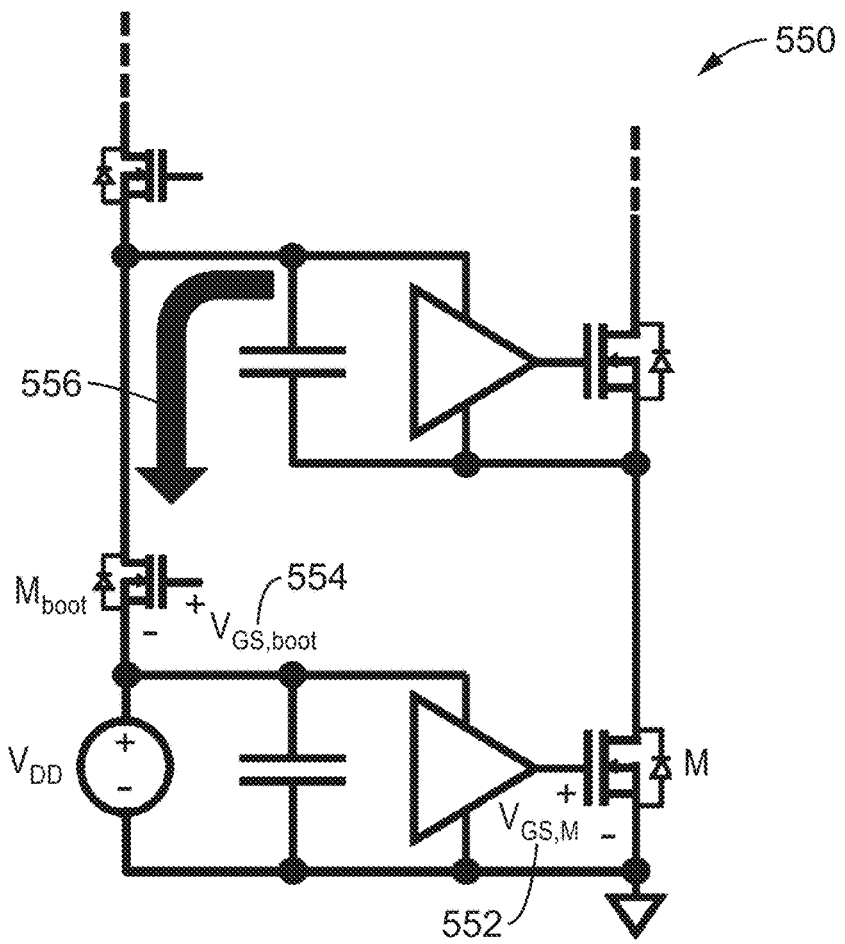
FIG. 22 is a schematic depicting surge current flow should the timing criteria for control signals to VGS, boot and VGS,M not be met, as depicted in FIG. 23.
Figure 23:
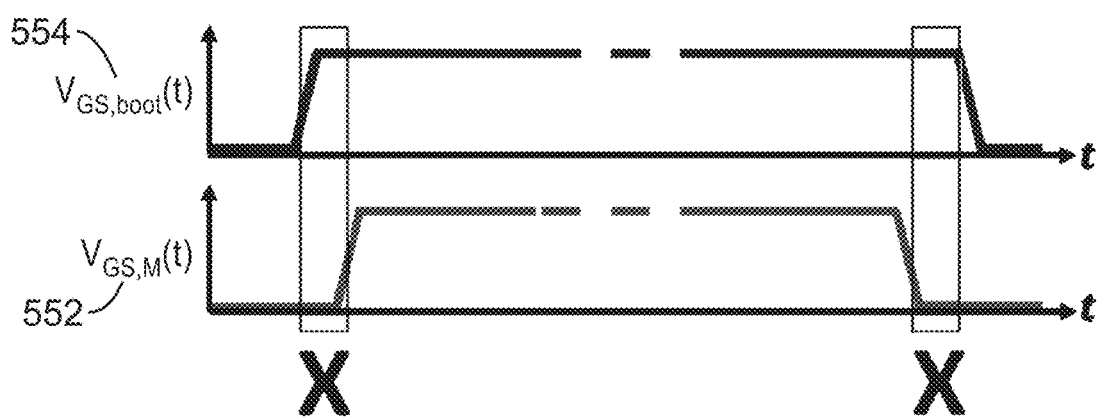
FIG. 23 is a waveform plot situation in which the required timing criteria for voltage $V_{GS,M}$ and voltage $V_{GS,boot}$ are not met.

If $M_{boot}$ is not turned on within this window such as depicted in FIG. 22 and FIG. 23, then unintended and potentially damaging large reverse current transients can arise from a high-side bypass capacitor back down to the preceding low-side charge reservoir.

It will be seen in the figure that $V_{GS,boot}(t))$ must be within the ($V_{GS,M}$ (t)) waveform by a minimum positive time period $t_{LH}$. Referring to FIG. 3, the time $t_{LH}$ is defined by the RC time constant of $R_1$ and the intrinsic gate capacitance, $C_{ISS}$, of $M_{boot}$, provided that $C_p$ is large. When $C_p$ is large it stores a DC voltage approximately equal to the local bypass capacitance voltage, or $V_{DD}$ in FIG. 3, effectively performing voltage level translation. $D_1$ acts to bypass $R_1$ during the falling edge and allows $M_{boot}$ to rapidly turn off at the same time as M with a marginally acceptable $t_{HL}$ of zero seconds. $D_2$ and $R_2$ are high impedance elements that act to bias $C_p$ at approximately $V_{DD}$ in steady-state.

FIG. 5 depicts Vas waveforms occurring at the turn-on of primary switching device M, seen as $V_{GS,M}$. Since the RC-delayed gate signal for $M_{boot}$, as generated by the schematic in FIG. 3, seen as $V_{GS,RC}(t)$ begins rising at the same time as $V_{GS,M}$, its slope must be greatly reduced such that $M_{boot}$ does not turn on until primary switching device M has fully turned on (signifying $V_{DS,M}=0V$), and as such, the conduction interval is quite significantly shorter than otherwise achievable. Conversely, the proposed buffered signal $V_{GS,boot}(t)$ may turn on sharply, allowing $M_{boot}$ to reach minimum $R_{DS,ON}$ much sooner.

The above RC-delayed approach of FIG. 3 eliminates diode voltage drops and alludes to the possible omission of local regulation stages. However, the slope of this rising RC-delayed gate signal (VGS,RC(t) in FIG. 5) must be severely limited. For high frequency converters this delayed turn-on limits the conduction time of $M_{boot}$ and allows the aforementioned voltage droop issues to persist.

2. Bootstrap Power Conversion

Figure 6:
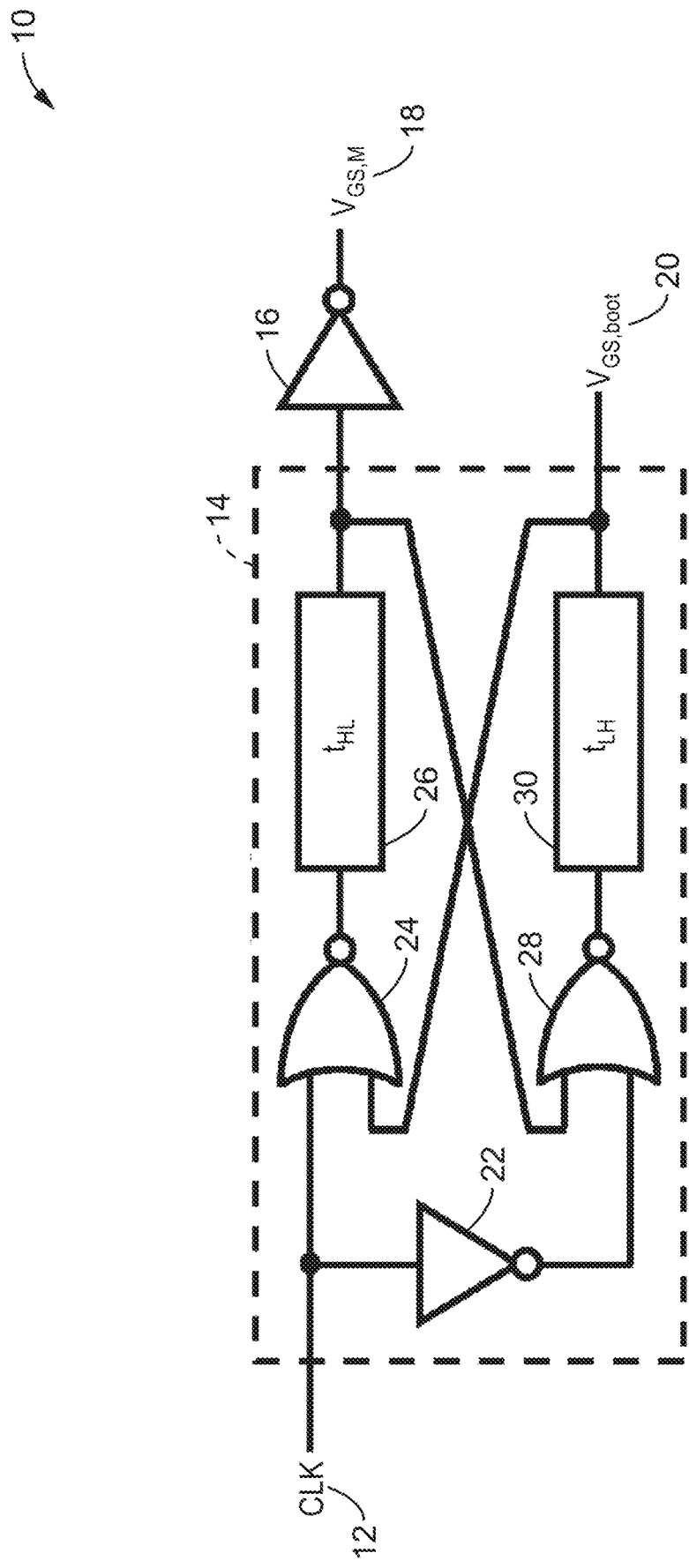
FIG. 6 is a schematic of a mechanism for locally generating synchronous bootstrap signals using modified dead-time control circuitry according to at least one embodiment of the present disclosure.

FIG. 6 illustrates an example embodiment 10 of synthesizing an appropriate synchronous bootstrap signals locally using 14 modified dead-time control circuitry, and can be easily integrated on-chip within existing gate driving solutions. Time delays $t_{HL}$ 26 and $t_{LH}$ 30 are kept as short as possible while avoiding shoot-through currents within the bootstrapping network. This non-overlapping clock generator 14 is shown with CLK 12 directed to an input of NOR gate 24, and inverted and received at an input of NOR gate 28. The output of NOR gates 24 and 28 are each connected through the delays $t_{HL}$ 26 and $t_{LH}$ 30, respectively, to their respective outputs. Each output feeds back an input to an input pin of the opposing NOR gate. The figure depicts a first output $V_{GS,boot}$ 20 and the second output through inverter 16 to output VGS,M 18.

Figure 7:
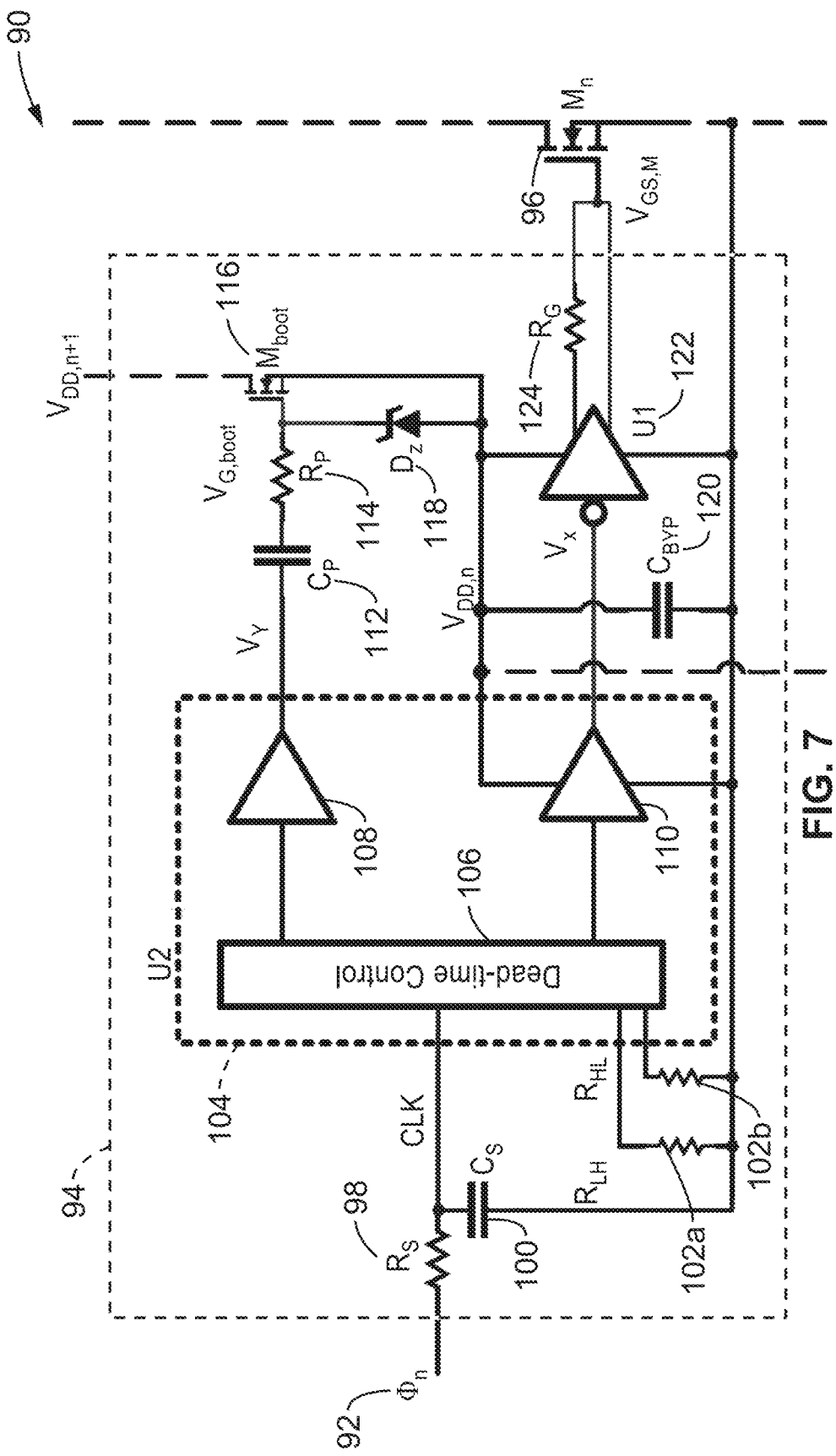
FIG. 7 is a schematic of a synchronous boot-strap gate-driver including a dead-time control, an output driver stage, and a level-shifting charge-pump to drive switches in a bootstrap power path, according to at least one embodiment of the present disclosure.

FIG. 7 illustrates an example embodiment 90 of a synchronous boot-strap gate-driver including a dead-time control IC, $U_2$ 104, an output driver stage, $U_1$ 122, and a level-shifting charge-pump to drive $M_{boot}$ 116 comprised of a gate driver 108, level-shifting capacitor CP 112, ringing damping resistor RP 114, and clamping Zener diode DZ 118 to ensure correct biasing on CP 112. The charge-pump may be omitted if $M_{boot}$ is instead implemented using a depletion mode device. In this example embodiment, the operation of a conventional deadtime control IC $U_2$ 104 is modified using both the inverting gate driver $U_1$ 112 and the described charge pump. The control IC $U_2$ 104 of this embodiment also includes control resistors $R_{LH}$ 102a and $R_{HL}$ 102b to set the deadtime durations $t_{HL}$ 26 and $t_{LH}$ 30 (referring to FIG. 6). Components $R_S$ 98 and $C_S$ 100 are optionally included to improve susceptibility to interference due to either conducted or radiated electromagnetic interference. The dead-time IC 104 may additionally include level-shifting or an isolation barrier for the clock signal $\phi_n$ 92.

Figure 8:
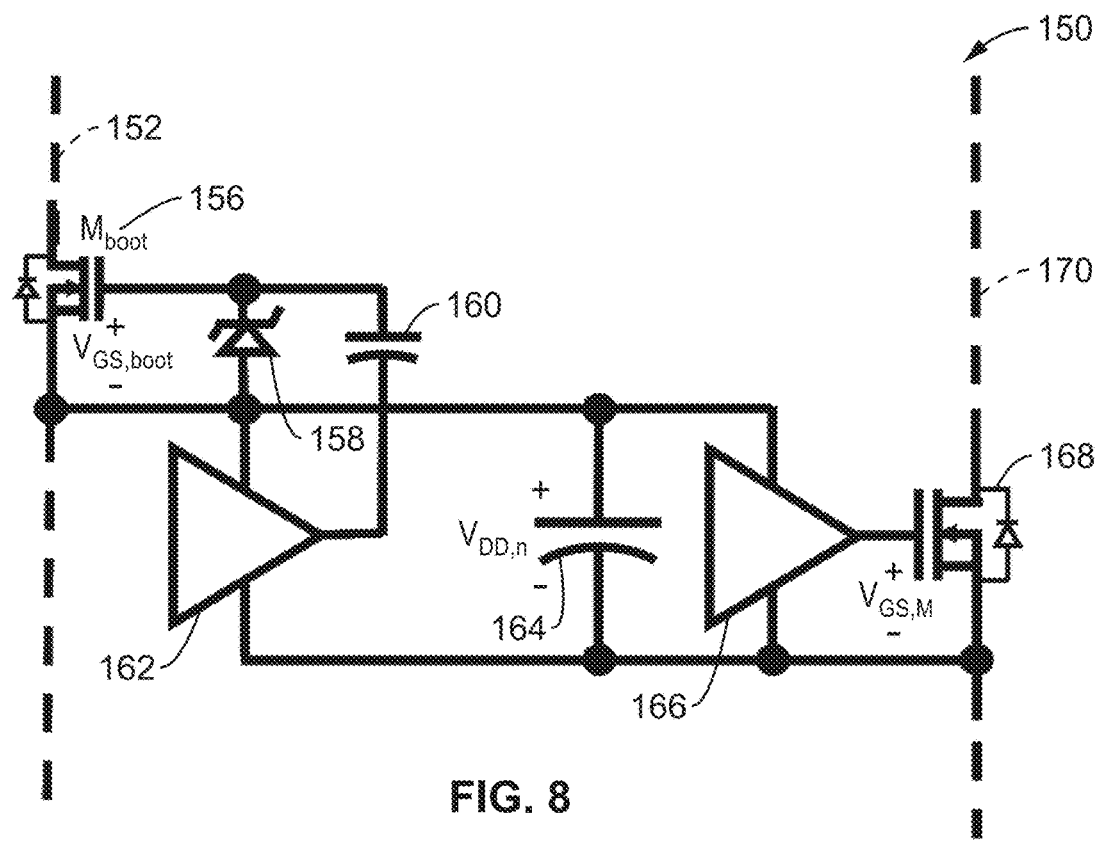
FIG. 8 is a schematic of diode clamped capacitive level shifter, directly driving the gate of $M_{boot}$ according to at least one embodiment of the present disclosure.
Figure 9:
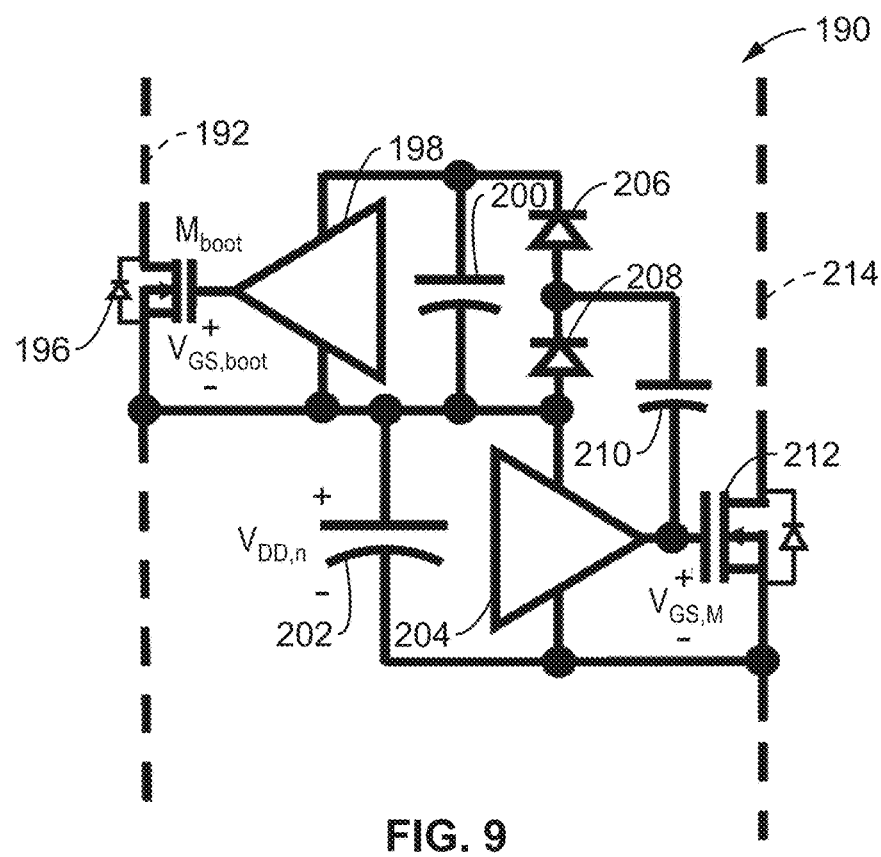
FIG. 9 is a schematic of a high-side gate driver directly driving $M_{boot}$ according to at least one embodiment of the present disclosure.

FIG. 8 and FIG. 9 illustrate example embodiments 150, 190 of appropriate circuitry for driving $M_{boot}$.

In FIG. 8 is a diode clamped capacitive level shifter, directly driving the gate of $M_{boot}$ 156 on the bootstrap bias voltage path 152. Gate driver 162 is directed through level-shifting capacitor 160, and clamped within an appropriate voltage range by diode 158 (e.g., a Zener diode) to drive the gate of FET 156. A resistor or other clamping element (e.g., diode, clamping circuit) may alternatively be used in place of the Zener diode 158. Energy is either partially or fully provided to the gate driver 162 by bypass capacitor 164 which stores a local voltage $V_{DD,n}$. When $M_{boot}$ 156 is activated, charge flows through $M_{boot}$ 156, via the bootstrap bias voltage path 152, either to, or from, bypass capacitor 164. In this way charge is shared between adjacent synchronous bootstrapping cells without the introduction of any diode forward voltage drops, and with the added capability of bidirectional charge flow. The energy stored on bypass capacitor 164 is also used to power gate driver 166 whose output drives switching device 168 to voltage $V_{GS,M}$ on power line 170.

In FIG. 9 is shown a high-side gate driver 198 directly driving $M_{boot}$ 196 on bootstrap line 192. In this case power is delivered to the high-side driver 198 using two diodes 206, 208 and a capacitor 210 to form a charge pump. Energy is stored locally at gate driver 198 using a bypass capacitor 200. Synchronous FETs may alternatively be used in place of the diodes. A variation on this solution may be preferable for a fully integrated solution. Again, the gate driver 198 can activate $M_{boot}$ 196 by driving $V_{GS,boot}$ high. Again, bypass capacitor 202 stores a voltage $V_{DD,n}$ and is used both to provide charge to the bootstrap conduction path 192, and to power gate driver 204 whose output drives switching device 212 to voltage $V_{GS,M}$ on line 214, and is capacitively coupled 210 to the intersection of diodes 206, 208, thereby affecting a charge pump to deliver power to highside gate driver 198 via bypass capacitance 200. Alternatively, a separate dedicated charge pump gate driver may be implemented to operate the charge pump in place of 204.

Figure 10:
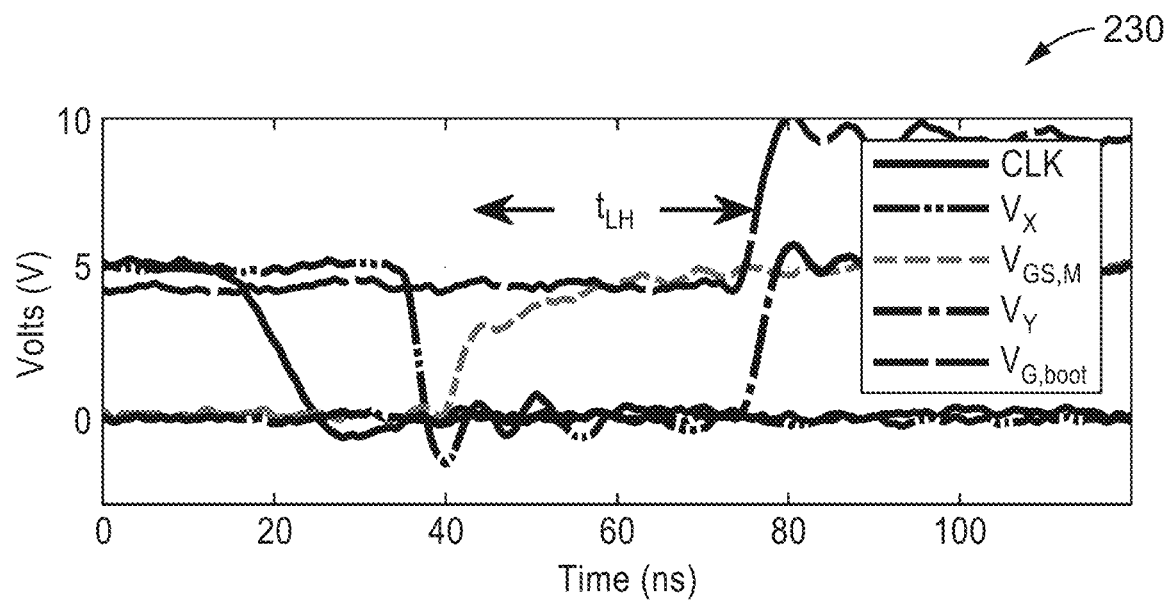
FIG. 10 is a waveform plot of synthesizing a $V_{GS,boot}$ signal with respect to $V_{GS,M}$, showing the rising edge according to at least one embodiment of the present disclosure.
Figure 11:
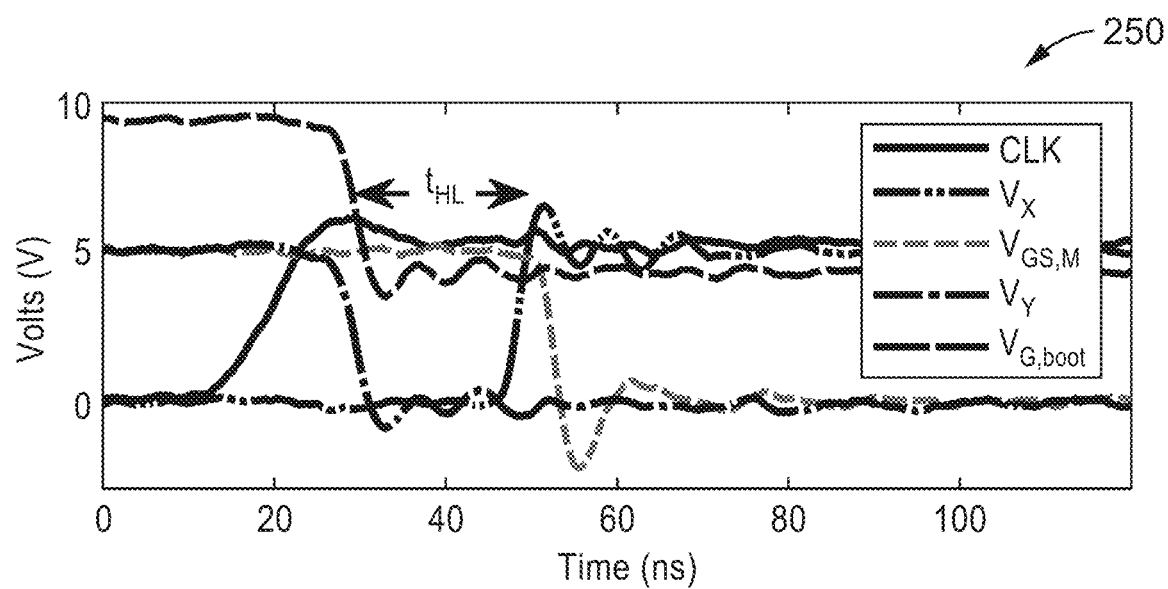
FIG. 11 is a waveform plot of synthesizing a $V_{GS,boot}$ signal with respect to $V_{GS,M}$, showing the falling edge according to at least one embodiment of the present disclosure.

FIG. 10 and FIG. 11 illustrate example measured voltage waveforms 230, 250 demonstrating correct synthesis of $V_{GS,boot}$ (=$V_{G,boot}$-$V_{DD,n}$) with respect to $V_{GS,M}$, where $V_{DD,n}$=5V. FIG. 10 zooms in on the rising edge, while FIG. 11 zooms in on the falling edges of $V_{GS,M}$. The plot depicts waveforms for the CLK, $V_X$, $V_{GS,M}$, $V_Y$, $V_{G,boot}$ as labelled in FIG. 7. It can be seen in FIG. 10 that $V_Y$ and corresponding level-shifted waveform $V_{G,boot}$ only goes high after a programmed delay of $t_{LH}$ from the rising edge of $V_{GS,M}$; while in FIG. 11 $V_X$ and corresponding level-shifted waveform $V_{G,boot}$ goes low before $V_{GS,M}$ falls by time interval $t_{HL}$, thus avoiding any possibility of shoot-through currents while simultaneously maximizing the conduction window of $M_{boot}$. That is, these example waveforms more closely resemble the ideal waveforms depicted labelled as "VGS, boot(t)" in FIG. 4 and FIG. 5.

Figure 12:
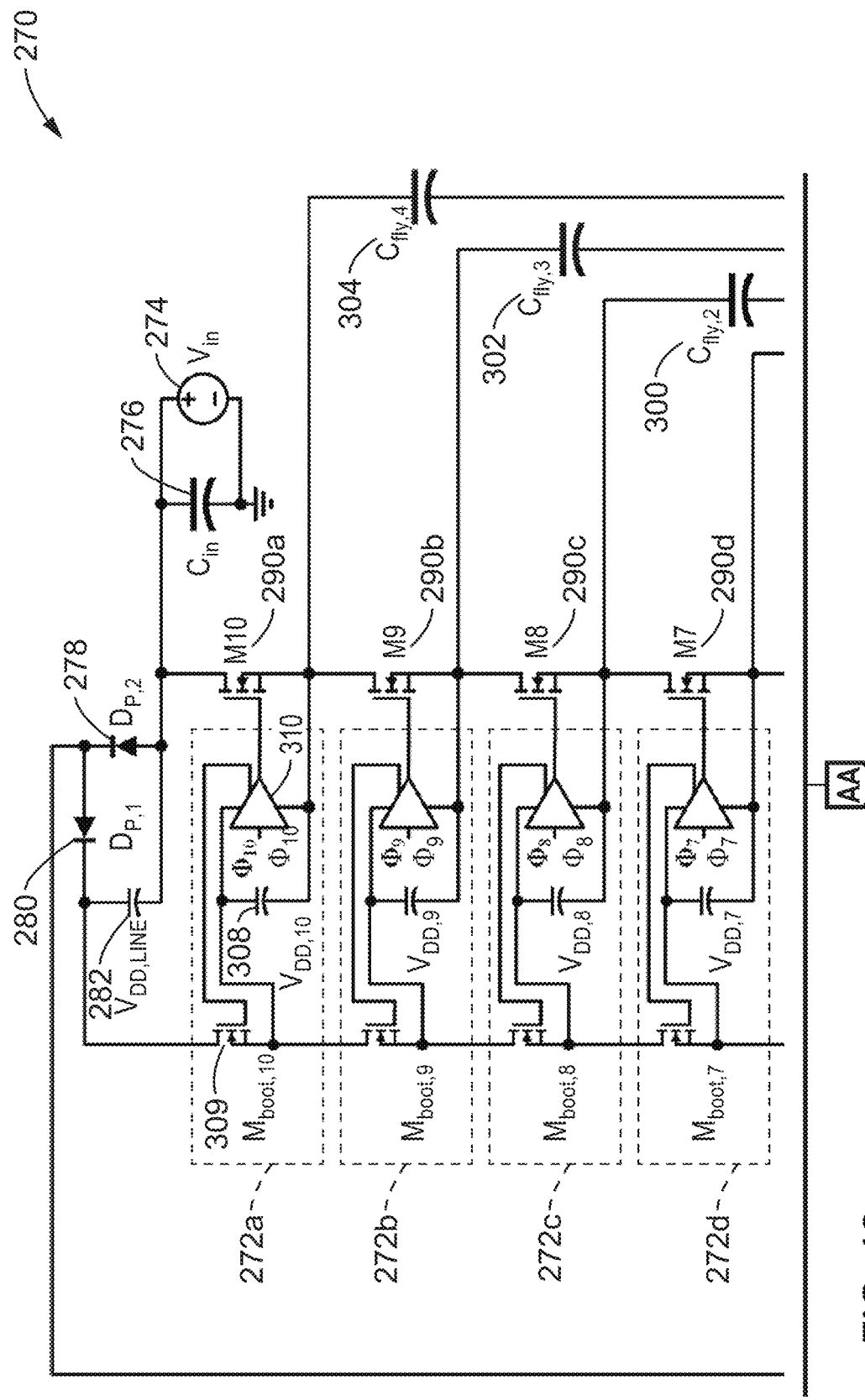
FIG. 12 and FIG. 13 is a schematic of a 6-level Flying Capacitor Multi-Level (FCML) using synchronous bootstrapping within each gate-driver, according to at least one embodiment of the present disclosure.
Figure 13:
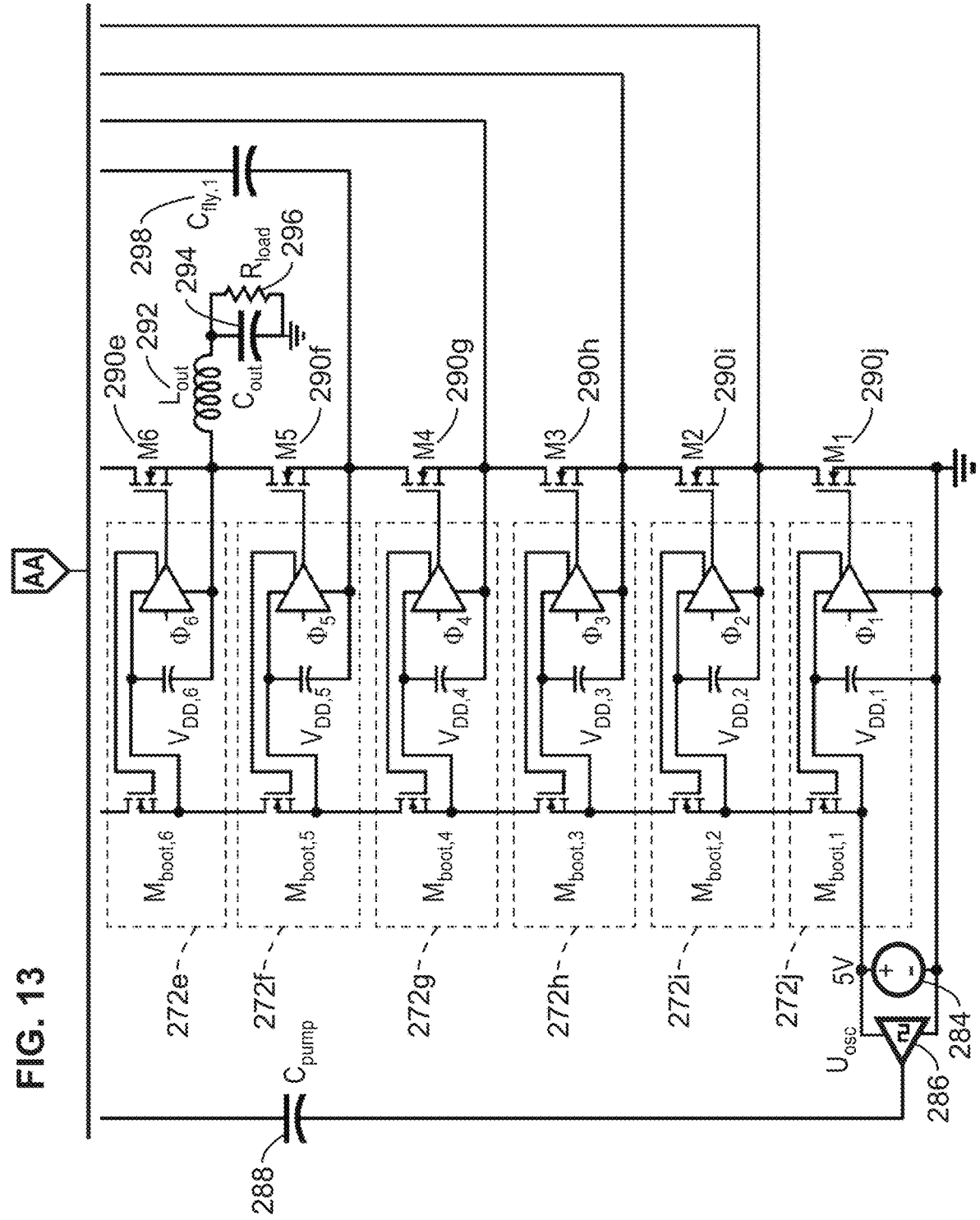

FIG. 12 through FIG. 13 illustrate an example embodiment 270 of a 6-level Flying Capacitor Multi-Level (FCML) power converter constructed using synchronous bootstrapping within each gate-driver.

Multiple switching stages, exemplified as ten stages 272a through 272j are utilized to drive and provide power to ten series connected switching devices (e.g., GaN), $M_{1-10}$ 290a through 290j. In at least one embodiment each of these switch stages is fabricated on a separate daughterboard for populating the converter circuit board. For example, in device 272a, is seen input capacitor 308 to gate driver 310 which drives its own synchronous bootstrapping switch $M_{boot,10}$ 309. The output of section 272a drives switching device 290a. The other stages are similarly connected to switching devices 290b through 290j. Appropriate input control signals $\phi_n$ are specific to the power converter topology and control scheme used, and are typically generated on a proximal controller (e.g., MCU, FPGA). As such, this disclosure does not describe the correct synthesis of control signals $\phi_n$ to operate the power converter, which is dependent on specific converter implementation and desired operation. Rather, the invention disclosed here uses the provided input control signals $\phi_n$ to drive primary switching devices 290a through 290j, as is typical, but distinctly; to also locally synthesize appropriate related control signals for synchronous bootstrap switching devices (Mboot,1 through Mboot,10 309), where the latter control signals are generated in strict adherence to the timing criteria defined in FIG. 4.

Multiple flying capacitors are seen coupled between the stages, with capacitor 298 coupled between the intersection of switching devices 290f and 290g and the intersection of switching devices 290d and 290e. However, the specific arrangement of coupling capacitors between primary switching devices (290a to 290j) in the power converter is dependent on the specific power converter's topology and design, and may be significantly altered from this example converter implementation. As such, the arrangement of coupling capacitors is not the focus of this disclosure. Instead, the disclosed invention is applicable to any sequential or series connection of primary switching devices, of which there may be a multitude of in a given power converter topology.

In this example embodiment, voltage source 284 represents the location at which power is injected into the bootstrapping gate drive power delivery network. An additional charge pump, comprised of $U_{osc}$ 286, $C_{pump}$ 288 $D_{p,1}$ 280, and $D_{p,2}$ 278, with bypass capacitor 282, is included to provide a 5V line referenced supply, $V_{DD,LINE}$, and allows power to be delivered from both ends of the boot-strapping network, further reducing voltage droop.

FIG. 14 through FIG. 17 illustrate example results 330, 350, 370, and 390 from the embodiment of FIGS. 12 and 13.

Figure 14:
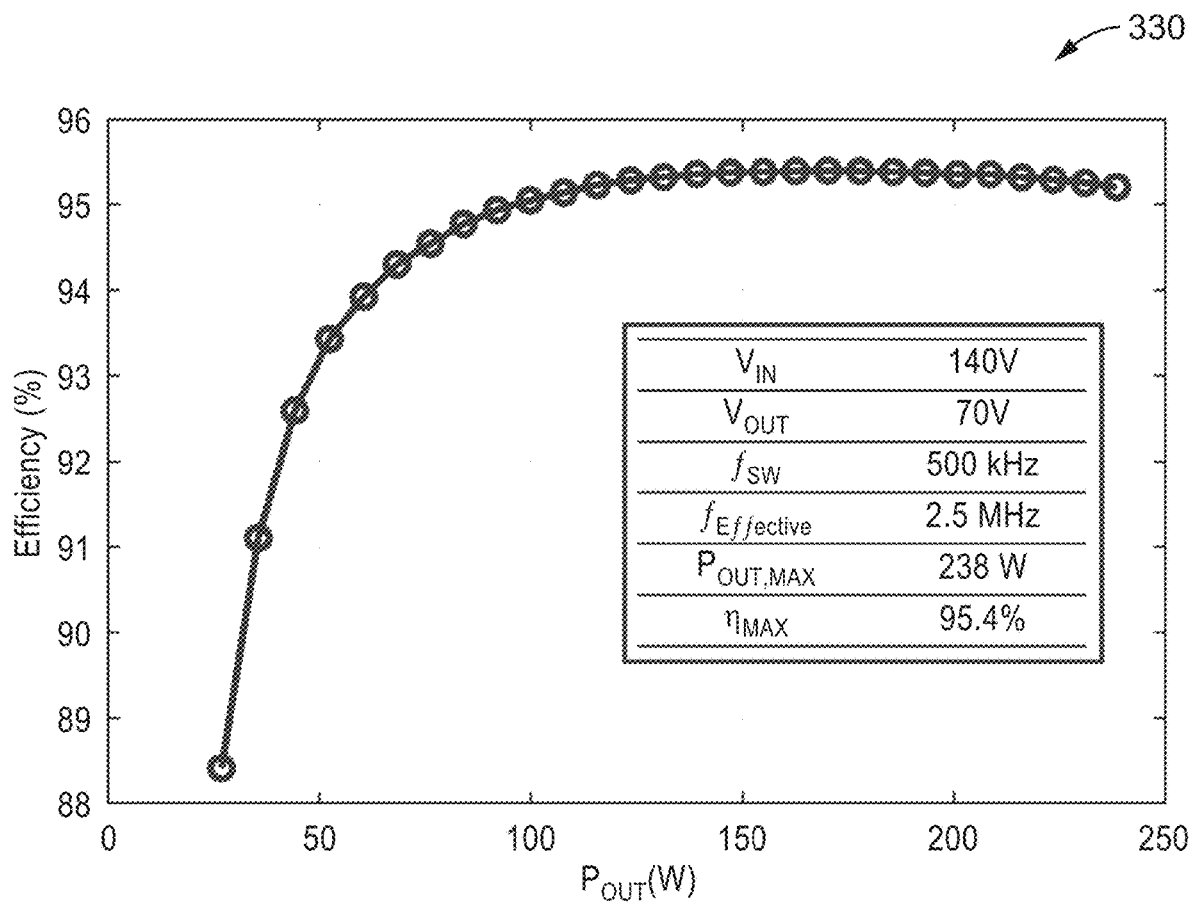
FIG. 14 is a plot of measured efficiency versus output power for the example 6-level FCML prototype implementation of FIG. 12 through FIG. 13.

In FIG. 14 is depicted measured efficiency versus output power for the example 6-level FCML prototype implementation with $V_{IN}$=140V and a 50% duty cycle on all control signals $\phi_n$, demonstrating correct functionality and high performance when using the disclosed bi-directional synchronous bootstrapping technique.

Figure 15:
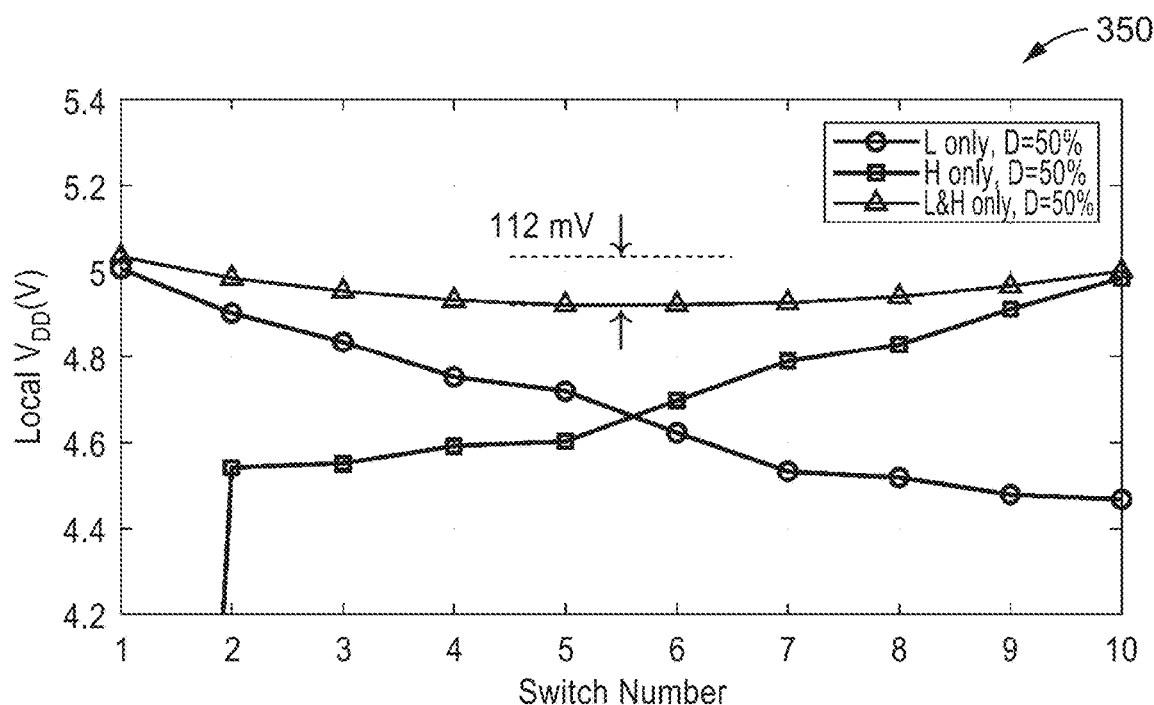
FIG. 15 through FIG. 17 are plots of local voltage levels, $V_{DD,n}$, within each synchronous bootstrapping circuit for the multiple $M_{boot}$ switches of FIG. 12 and FIG. 13, shown for different duty cycles, according to at least one embodiment of the present disclosure.
Figure 16:
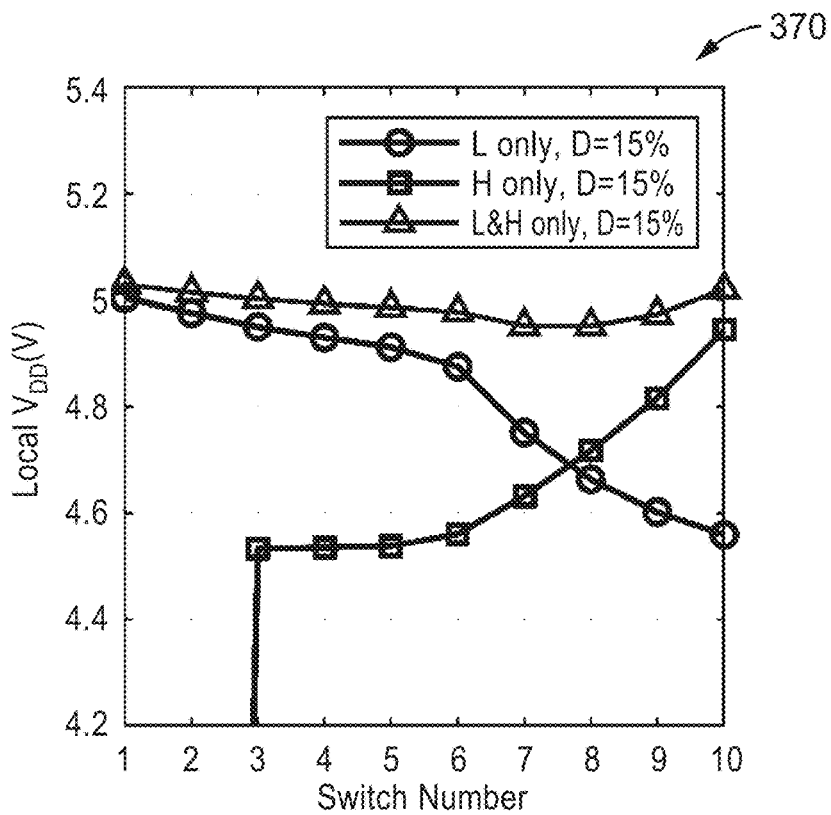
Figure 17:
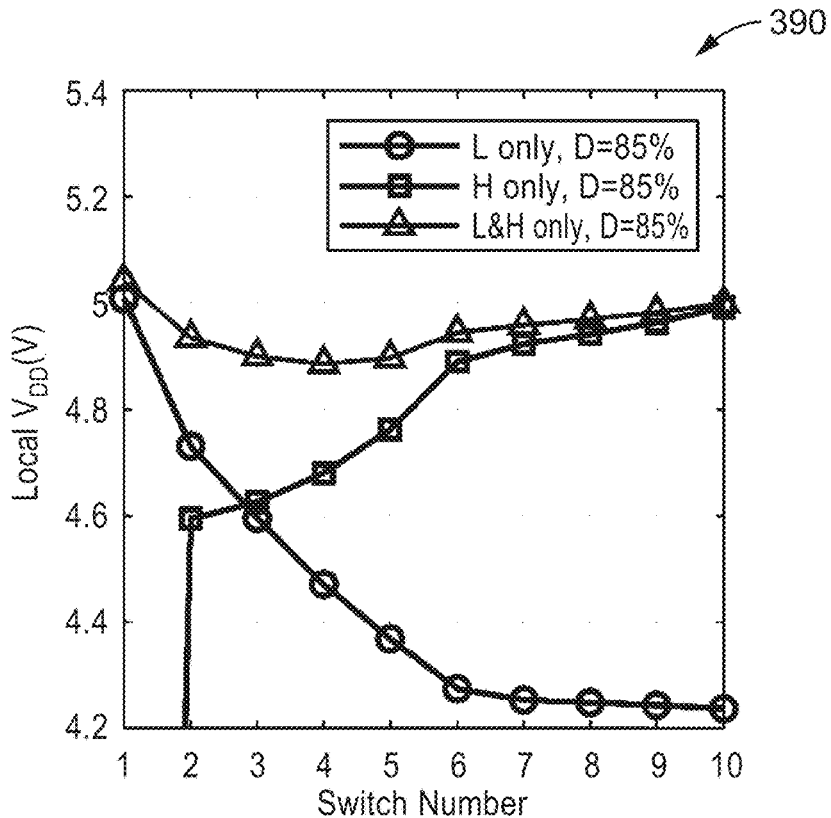

In FIG. 15 through FIG. 17 are shown 350, 370, 390 the local voltage levels within the gate driving circuitry for the 10 switches illustrated in the example embodiment of FIG. 12 and FIG. 13. Measured supply voltages across all 10 gate-drivers with varying duty cycles, FIG. 15 at 50% duty cycle, FIG. 16 at 15% duty cycle, and FIG. 17 at 85% duty cycle. Three permutations of power delivery are represented with low-side power only (sourced from 5V 284 supply in FIG. 12 and FIG. 13), high-side power only (sourced from $V_{dd,line}$ 282 in FIG. 12 and FIG. 13), and both simultaneously in each figure. The results for a 50% duty cycle are seen in FIG. 15. Applying power from both ends of the boot-strap network leads to a low maximum voltage droop of 112 mV across all 10 series connected switches under this 50% duty cycle.

A synchronous boot-strapping technique is described below that applies controlled timing delays, such that a sharp buffered gate-drive signal which can be quickly applied to $M_{boot}$ as soon as associated primary switching device M has fully turned on. This approach avoids the RC-settling observed in VGS,RC of FIG. 5 and enables $M_{boot}$ to conduct for its full allowable duration ($V_{GS,boot}$ in FIG. 5), with minimum $R_{DS,ON}$. In turn, this results in maximum charge being transferred and extends the achievable frequency of operation while minimizing voltage droop on successive cascaded gate drivers.

3. Synchronous Bootstrap with Maximized On-Time

There are several ways in which to generate the ideal $V_{GS,boot}$ signal depicted in FIG. 4 and FIG. 5, such that it maintains precise timing relationships to $V_{GS,M}$, as defined by $t_{HL}$ and $t_{LH}$. In the following embodiments, instead of using separate level-shifted clock signals to control M and $M_{boot}$ (with $t_{XX}$ defined within the controller), $V_{GS,boot}$ is synthesized locally from the same single level-shifted signal destined for M.

As was seen in FIG. 6, a classic non-overlapping clock generator may be modified to include an additional inverter on its output; resulting in a Vas, boot waveform that exclusively overlaps with $V_{GS,M}$, thereby providing the desired ideal buffered waveforms depicted in FIG. 4.

To demonstrate this in hardware, existing integrated dead-time circuitry was leveraged, making this approach viable as a fully integrated circuit (IC) gate-drive solution. In FIG. 7 was depicted the gate-drive circuitry used to demonstrate appropriate synthesizer gate signals for both the primary switching device, M, and its associated boot-FET, $M_{boot}$. In this example the internal dead-time circuitry of a high-speed commercial GaN gate-driver $U_2$ 104 was used to provide tuned delays, with an additional gate-drive IC $U_1$ 122 providing the required signal inversion as highlighted in the figure. Similar to $C_P$ in FIG. 3, in FIG. 7 capacitor $C_P$ 112 maintains a 5V offset allowing a level-shifted drive signal to be applied to $M_{boot}$ 116. However, it should be noted that a depletion mode device may instead be used, eliminating the need for components $C_P$, $R_P$ and $D_Z$. $R_P$ is employed in this example embodiment to limit $V_{GS,boot}$ overshoot and ringing given that the gate driver producing $V_Y$ is greatly oversized for this application. $D_Z$ 118 ensures that approximately 5V is maintained on $C_P$ 112 and is a discrete alternative to $D_2$ and $R_2$ in FIG. 3. $R_s$ 98 and $C_s$ 100 are optional noise filtering components. The time durations of $t_{HL}$ and $t_{LH}$ may be adjusted via changes to $R_{LH}$ and $R_{HL}$ as per the specific requirements of the selected commercial gate driver $U_2$ 104. Measured voltage waveforms validating intended operation are depicted in FIG. 10 and FIG. 11 with specific component values used being listed in Table 1.

Alternative mechanisms for driving $M_{boot}$ were shown in FIG. 8 and FIG. 9. In FIG. 9 was seen that a high-side gate driver may be used to drive $M_{boot}$ directly, in which power must be delivered to the driver that drives $M_{boot}$. In FIG. 9 a charge pump design was shown in which power is delivered using one pump capacitor 210 and two diodes 206, 208.

4. Application to a 6-Level FCML

The described synchronous boot-strapping circuitry was demonstrated within a 6-level FCML converter example, depicted in FIG. 12 and FIG. 13 and in which there are ten GaN switching devices connected in series ($M_{1-10}$), although the technique may be used in any number of power converter topologies in which there are series connected switching devices. By way of example and not limitation the applicable topologies may include but are not limited to: Dickson, Greinacher/Cockcroft-Walton, Ladder, Series-Parallel, Fibonacci, Multi-Level, Switched-Tank, LEGE, MLB, Dual-Inductor-Hybrid converters, and so forth.

In this particular example of FIG. 12 and FIG. 13, these switches are controlled using ten copies of the daughterboard which includes all components contained within highlighted regions 272a through 272j. Here, ten much smaller GaN-FETs, serving as $M_{boot}$, are used to replace the diodes used in a conventional cascaded bootstrap. While validating this boot-strapping approach in hardware, power and voltage levels were maintained significantly lower than rated, while the converter was switched at 500 kHz, resulting in the FCML's output inductor seeing an effective 2.5 MHz switching frequency with a line voltage, $V_{IN}$, of 140V (FIG. 14). Table 2 lists the components used to construct the power stage.

It should be noted that the present disclosure provides a demonstration of bi-directional energy delivery throughout a cascaded bootstrapping network. Since $M_{boot}$ can conduct in either direction when turned on, dissimilar to a diode, it follows that a gate driver may receive energy from the high-side driver immediately above it, provided it can access this energy. Thus, this gate driver must possess sufficient initial charge to push the gate of its $M_{boot}$ high, thereby enabling charge to flow down onto its local bypass capacitor.

The requirement to store charge locally in order to facilitate access to energy provided by gate drivers higher up the bootstrapping chain, may necessitate an initial upward flow of energy from a ground referenced supply (5V in FIG. 12 and FIG. 13) at start-up, as is conventional.

However, once all gate drivers linked by synchronous bootstrapping are sufficiently charged, energy may be derived from a downward flowing line-referenced supply, labelled $V_{DD,LINE}$ in FIG. 12 and FIG. 13, in addition to the ground referenced upward flowing supply, $V_{DD,1}$. This essentially halves the impedance of the gate-drive power delivery path since charge may be delivered from both ends of the bootstrapping network. Alternatively, once a downward flowing charge path has been established, the ground referenced supply may be disabled with energy delivery from $V_{DD,LINE}$ becoming self-sustaining, although this may or may not be desirable in practice. In the example prototype of FIG. 12 and FIG. 13, a simple charge-pump consisting of an oscillator 286, a pumping capacitor 288, and two diodes 278, 280 was used to produce $V_{DD,LINE}$ 282, thereby allowing gate-driver energy to be fed into the chain via $M_{boot,10}$ 309. It should be noted that this line referenced source may also be generated using a fully isolated supply, or be charge-pumped from other fixed-offset bias points either within or proximal to the power converter.

Figure 24:
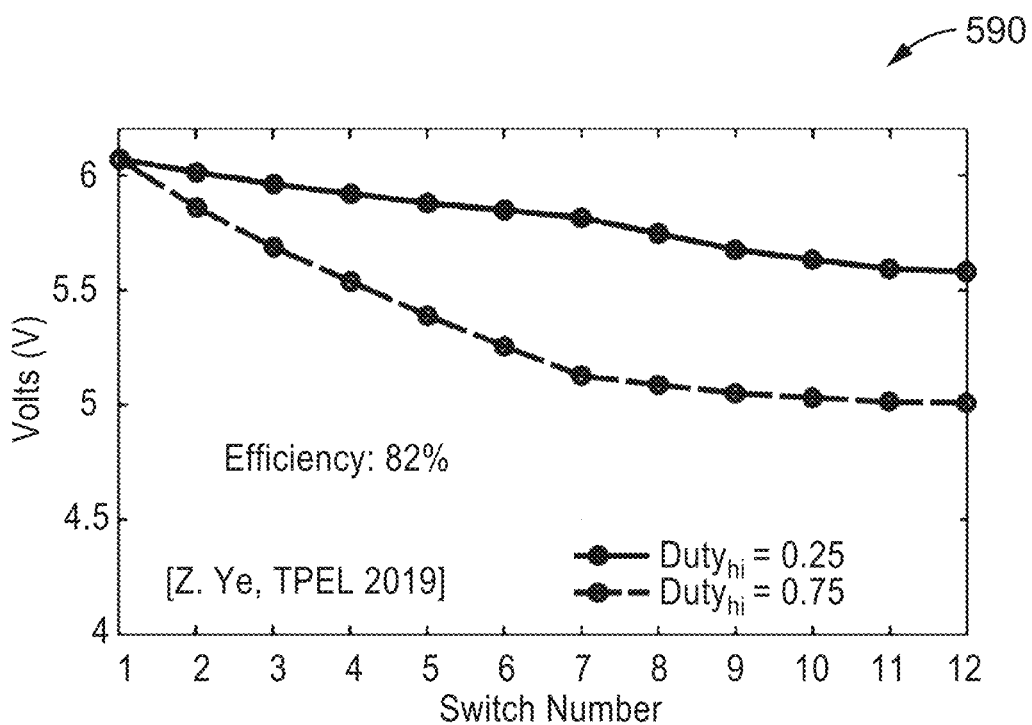
FIG. 24 is a plot of voltages at each gate driver in a cascaded chain of switching stages for duty cycles of 25% and 75% for the circuit of FIG. 3.

To validate the aforementioned concepts and demonstrate effective power delivery to all gate-drivers, the steady-state DC voltages stored on all 10 of the gate-driver's bypass capacitors (VDD,1 through VDD,10) was measured for FCML duty cycles of 15%, 50%, and 85% while switching at 500 kHz. For each of these operating points, gate-drive power was supplied either from the 5V low-side supply $V_{DD,1}$ 284, the charge-pump generated high-side supply $V_{DD,LINE}$ 282, or both simultaneously for minimal voltage droop throughout the chain. In FIG. 15 through FIG. 17 these results were documented to illustrate that when the synchronous boot-strapping network is fed energy from both a ground-referenced and line-referenced supply, a worst-case maximum voltage droop of 156 mV is observed across a wide duty cycle range of 15-85%, with the maximum 156 mV deviation observed in FIG. 17 along the curve labelled "L&H only, D=85%". This is a significant improvement over the RC-delayed synchronous approach which yielded a droop of approximately one Volt at a relaxed 75% duty cycle in the prior art (FIG. 24).

5. Benefits of the Approach of the Present Disclosure

Figure 36:
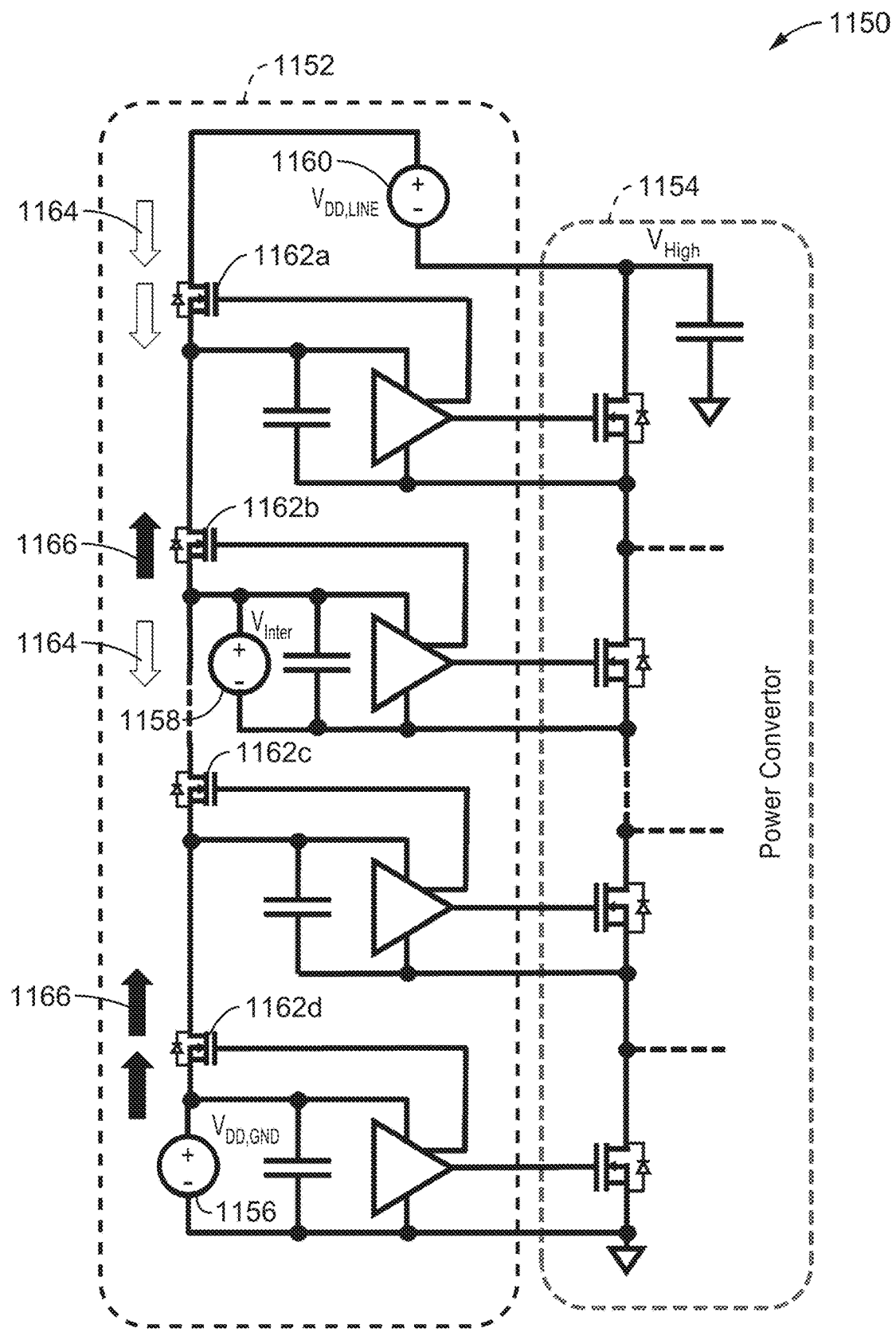
FIG. 36 is a schematic of a cascaded gate driver bootstrapping circuit in which charge can be injected at intermediary points in the bootstrapping network, according to at least one embodiment of the present disclosure.

This work demonstrates synchronous gate-drive power delivery can be achieved with an approach that greatly reduces volume as compared to conventional fully isolated solutions, as a result of the elimination of any bulky magnetic element. This approach performs significantly better than cascaded diode approaches due to the absence of any forward voltage drops, even eliminating the need for local regulation. Additionally, the boot-strap conduction duration is maximized, making it well suited for high frequency converters. Furthermore, appropriate boot-strap control signals may be generated locally within a given gate-driver eliminating the need for an additional level-shifted control signal, with the majority of components suitable for complete monolithic integration. Moreover, bi-directional energy flow has been demonstrated through a synchronous boot-strap network and it has been verified that voltage droop can be further reduced by applying power to both ends of the chain, approximately halving its impedance. Further expansion of this technique may include power injection into additional or alternative locations within the bootstrapping network, with charge capable of propagating in both directions from the site of injection as seen in FIG. 36.

This approach was successfully demonstrated as part of an example high level count FCML where power is delivered to ten series connected switches. A maximum voltage droop of 158 mV is observed across all switches over a wide switching duty cycle range of 15-85%, verifying that this approach is well suited for providing power to high-order switching networks, including those using gallium nitride which demand strict supply tolerances.

6. Comparing FCML Converter Approaches

Flying capacitor multilevel (FCML) converters are increasingly used in modern power supplies, inverters, and motor drives and one such converter is utilized here as an example topology to demonstrate the present disclosure. As discussed above, the technology can be applied to other types of power converters as well. FCMLs have a versatile topology that allows for an approximate $N^2$ reduction in the size of the magnetic components used, whereby N is related to the order of the surrounding switched-capacitor network. However, a large number of independent voltage sources are generally required to provide power to each of the gate drivers in an FCML converter.

The most common way that these voltage sources are provided is by using a fully isolated magnetics-based power supply for each source; however, this approach suffers from several drawbacks including a significantly increased overall converter volume, high cost and moderate levels of efficiency. Further commercial efforts have produced more compact power delivery solutions, but the reduced magnetic volume inevitably degrades performance while maintaining high cost.

Accordingly, non-isolated approaches have been explored, the most well-known of which are diode-based bootstrapping; such as utilized in half-bridge structures, in which upon activating a low-side switch, both bypass capacitors share a common bottom plate, and charge subsequently flows through a bootstrapping diode to increase the voltage stored on the high-side gate-driving circuitry's bypass capacitor, $V_{dd,n}$. However, it should be noted that due to the diodes inherent forward voltage drop, $V_{dd,n}$ will remain slightly less than the providing low-side supply voltage $V_{dd,n-1}$. However, this difference is often deemed negligible for low-level count converters such as the typical two-switch half-bridge, even when using wide bandgap switching devices.

Figure 18:
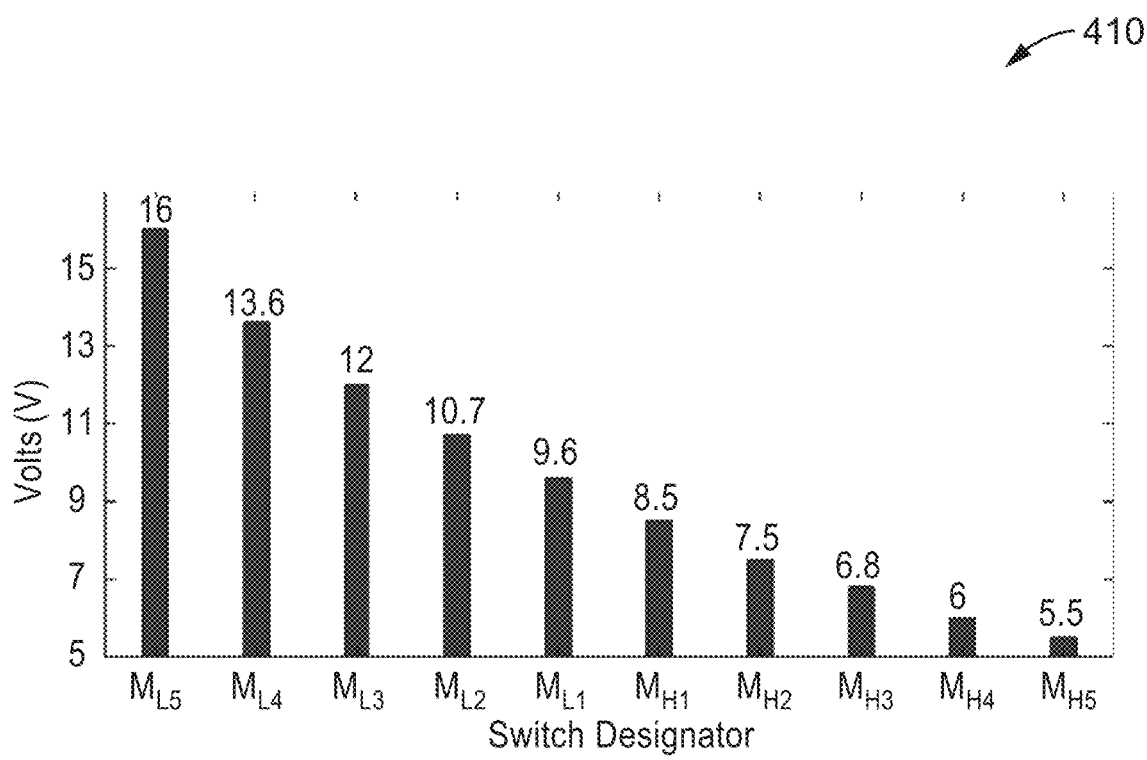
FIG. 18 is a waveform plot of bootstrap voltage droop in conventional cascaded drivers.

However, FIG. 18 illustrates an example 410 of the bootstrap voltage droop observed when diode-based bootstrapping techniques are used repeatedly over an example of ten cascaded gate drivers (referring to the method depicted in FIG. 1 or FIG. 2). In the example of FIG. 18, forward voltage drops will continue to accumulate for the whole length of the driver chain. In the figure it is seen that while the lowest gate driver ($M_{L5}$) is provided with 16V volts, the last gate drivers in the chain ($M_{H4}$ and $M_{H5}$) only receive about 6V, resulting in a wide-ranging and often unacceptable voltage variation delivered to the gate drivers of each switching device.

Figure 19:
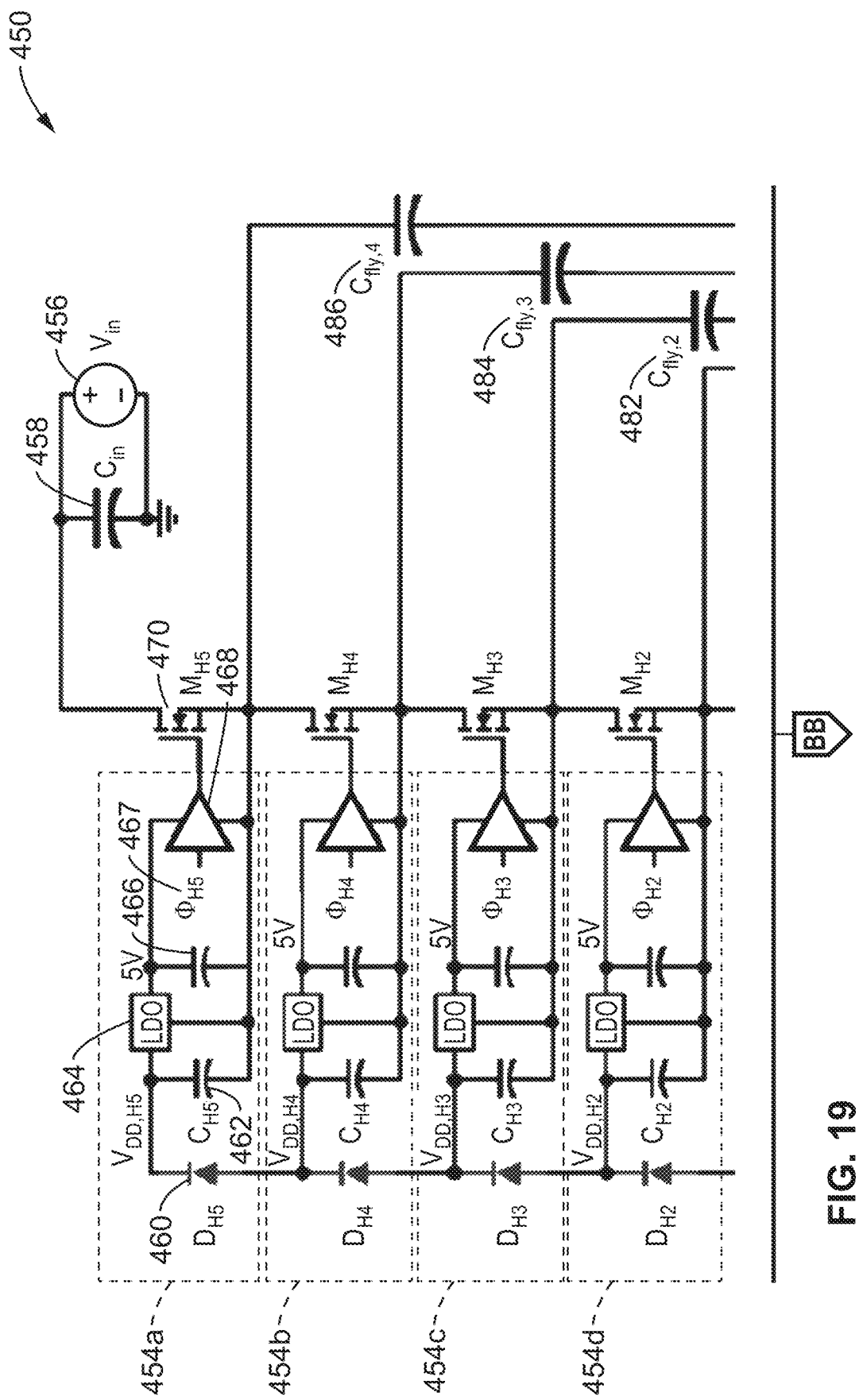
FIG. 19 and FIG. 20 is a schematic of a bootstrapped conversion circuit using conventional cascaded diodes and regulators in each gate driver.
Figure 20:
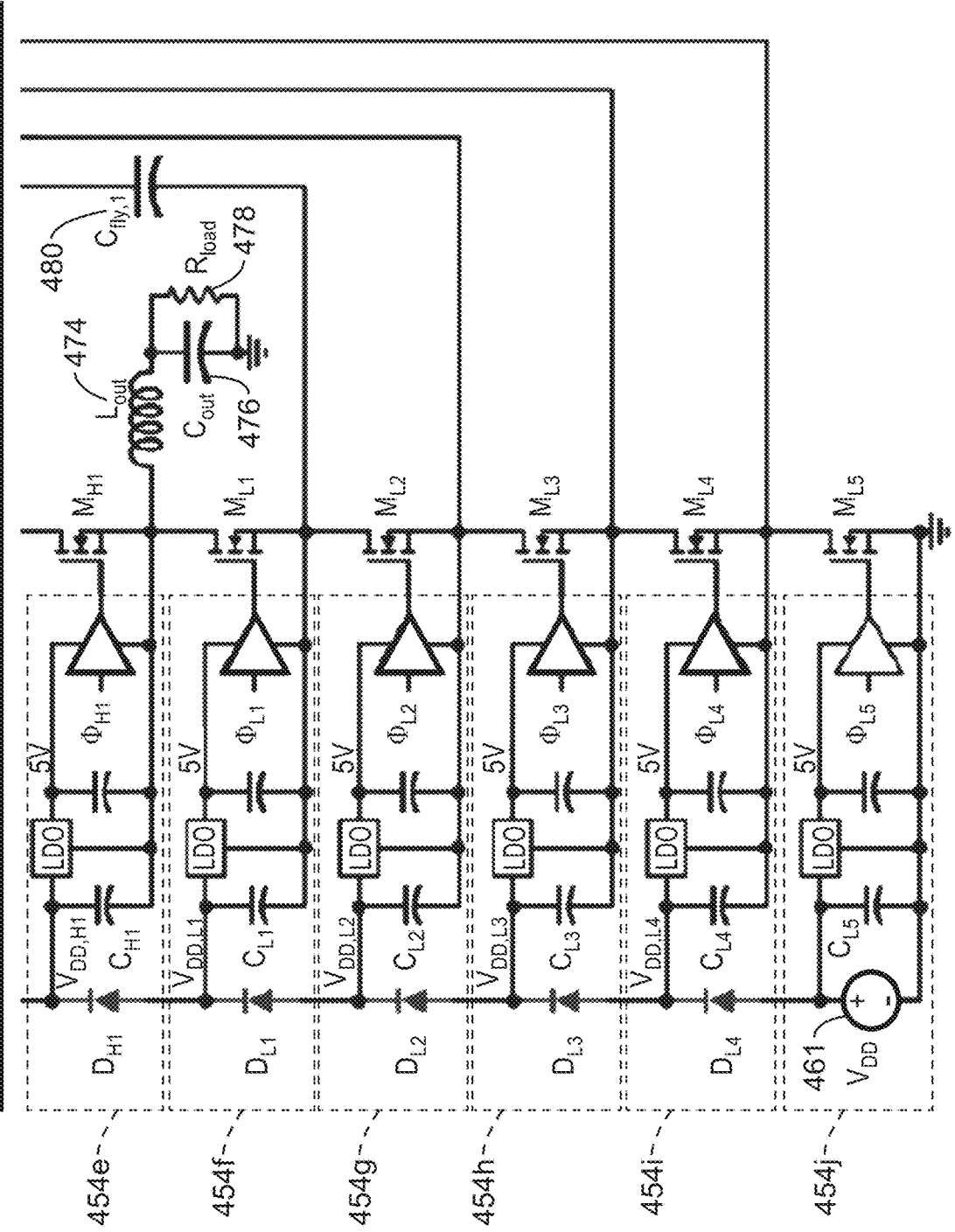

One previously demonstrated solution to this is to use local regulation within each gate driver as was illustrated in FIG. 2 and is shown in a specific example power converter implementation in FIG. 19 through FIG. 20. This is an alternative and worse performing solution to that depicted in FIG. 12 and FIG. 13, using the same FCML power converter stage as an example.

In FIG. 19 and FIG. 20 is illustrated a previously demonstrated example 450 of a bootstrapped conversion circuit using linear regulators 464 in each gate driver. The regulators, such as dedicated linear regulators, provide consistent voltage supplies to all devices. However, since this regulation is very lossy, poor gate drive power delivery efficiency is observed in practice. For example, should all gate drivers require a 5V supply, successive diode drops would mandate that 16V be provided at the beginning of bootstrapping network, $V_{DD}$ 461 as shown in FIG. 18. Subsequently, each linear regulator would need to reduce its received voltage (described in FIG. 18) down to 5V. This voltage reduction is very inefficient without the use of bulky magnetic elements.

The figure shows multiple gate drive and bootstrapping power delivery circuits 454a through 454j. A voltage input source 456 and capacitor 458 are coupled to through FETs $M_{H5}$ through $M_{H1}$ on the high side, then continues on a low side with $M_{L1}$ through $M_{L5}$. Output is seen going into a load modeled as inductance $L_{out}$ 474 in a parallel combination of capacitor 476 and resistor 478. As was the case for the embodiment depicted in FIG. 12 and FIG. 13, this embodiment is chosen as an example power converter since all of its primary switching devices, ML1 to ML5 and MH1 to MH5 170 are connected sequentially, resulting in sequential gate driver and bootstrapped power delivery circuitry 454a through 454j in this example.

Each gate drive and bootstrapping power delivery circuit or "switching circuit" (e.g., 454a), except for 454j, is shown with diode 460, into a low-drop out regulator 464 having an input capacitor 462 and an output capacitor 466. The output of this LDO is coupled to the driver 468 which is controlled by a phase signal (e.g., 467) that is dependent on desired converter operation and is typically generated locally on a proximal FPGA, MCU or other piece of dedicated clock generating hardware.

Switching circuit 454j has a voltage ($V_{dd}$) source 461 instead of the diode.

Four flying capacitors 480, 482, 484 and 486 are seen coupled between the low and high stages.

The above approach may still be desirable in certain applications since it has been demonstrated to achieve over a 50% reduction in overall converter volume relative to conventional isolated power delivery approaches.

Figure 21:
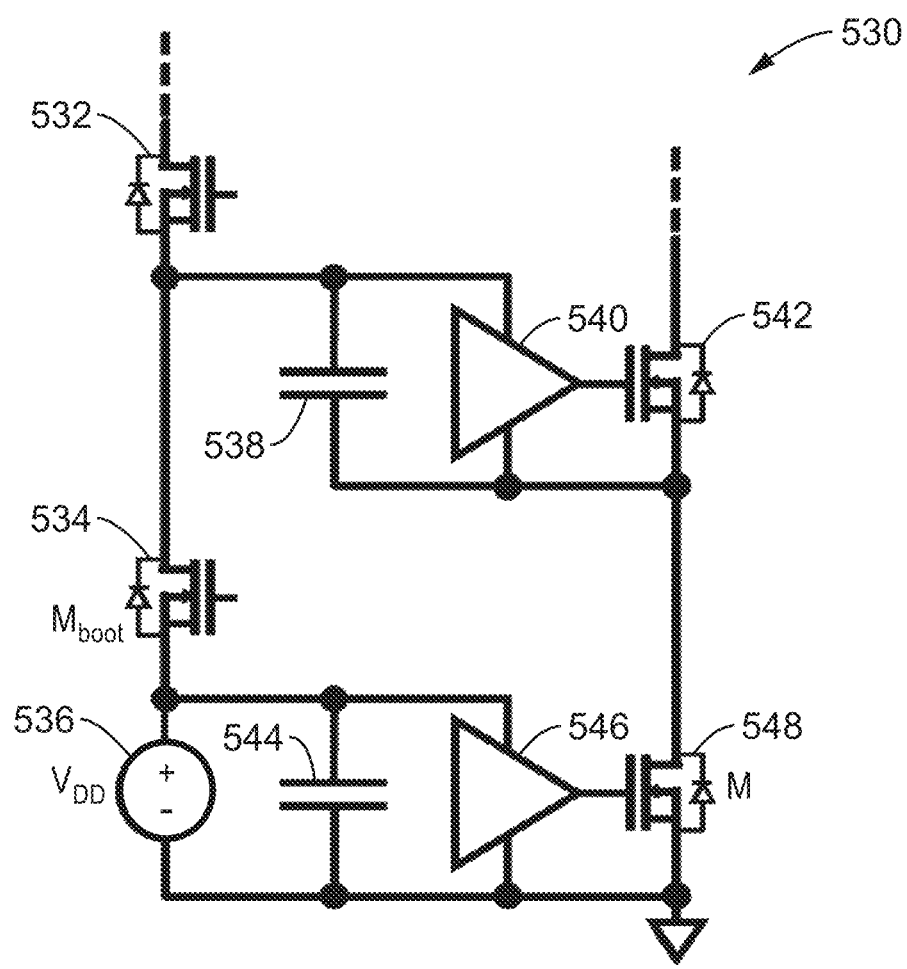
FIG. 21 is a schematic of a circuit for performing synchronous bootstrapping according to at least one embodiment of the present disclosure.

FIG. 21 illustrates an example embodiment 530 of a circuit for performing synchronous bootstrapping, and represents an improvement to both the fully isolated approaches and the approach depicted in FIG. 19 through FIG. 20. The bootstrapping diodes, as were seen in FIG. 19 through FIG. 20 are replaced with active switches 532, 534, labelled $M_{boot}$. These transistors do not have a forward voltage drop, and so yield improved performance in practice. However, appropriate signals must be generated to control these active devices, which are not shown in the figure. The figure depicts a bootstrapping $V_{DD}$ source 536 on the first stage, with capacitors 538, 544 on the supplies of gate drivers 540, 546 which are coupled to FETs 542, 548, respectively.

FIG. 22 illustrates an example 550 of erroneous current flow in the circuit of FIG. 21 should the timing criteria of FIG. 4 be violated (as depicted in FIG. 23). Ideally the gate-to-source voltage $V_{GS,M}$ 552 of the primary FET M, and the voltage $V_{GS,boot}$ 554 of the synchronous bootstrapping FET, $M_{boot}$, would be as depicted in FIG. 4. It should be noted that the boot-FET only turns on within the time interval that the primary FET is turned on, potentially with some margin for reliability. Should the bootstrapping transistor ever turn on outside of this specified interval (depicted in FIG. 23), there is a high risk of catastrophic surges 556 of charge flowing back down towards the low-side supply, similar to shoot-through when there is insufficient deadtime.

FIG. 23 illustrates an example 570 of timing conditions not being met for voltage $V_{GS,M}$ 552 and voltage $V_{GS,boot}$ 554 as seen previously in FIG. 4.

Perhaps the most well-known approach to generate appropriate signals, is that which was publicized recently as was seen in FIG. 3. The following plots illustrate shortcomings of that approach.

FIG. 24 illustrates an example 590 of voltage droop at the different switch numbers and efficiency for the circuit of FIG. 3. It is seen that the voltage droop is largely mitigated from that seen in FIG. 18. The measured voltages on the switching stages for duty cycles of 0.25 (25%) and 0.75 (75%) are shown in the figure. Thus, rather than requiring 16V on the input, here only 6V is required to provide at least 5V to all gate drivers across a range of operational duty cycles. However, this approach has limitations at high switching frequencies where the RC-delay limits the quantity of charge that can be conducted through $M_{boot}$ within a switching period.

Figure 25:
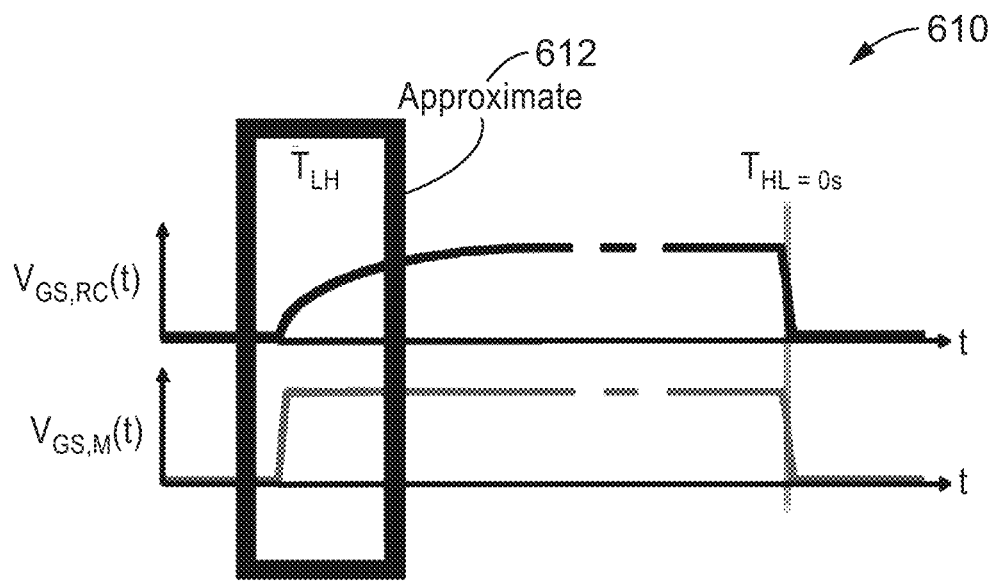
FIG. 25 is a waveform plot of approximated waveforms for the circuit of FIG. 3 which fail to match the ideal signals.

FIG. 25 illustrates example waveforms 610 from that approach of FIG. 3. As seen in the figure, rather than generating the ideal signals from FIG. 4 exactly, this solution attempts to approximate 612 these waveforms using an introduced RC time constant to delay the boot-FETs rising edge. Looking back to FIG. 3, this rising edge delay is set by resistor $R_1$ and the internal $C_{ISS}$ input capacitance of the boot-FET itself. Capacitor $C_P$ is large, storing a voltage of $V_{dd}$, and simply acts as a level shifter. During the falling edge, resistor $R_1$ is bypassed by diode $D_1$, and the boot-FET turns off at approximately the same time as the primary FET.

To understand this, FIG. 5 magnifies the rising edges of the FET drive signals for the circuit of FIG. 3 (labelled $V_{GS,RC(t)}$). The ideal voltage waveform $V_{GS,boot}$ at the boot-FETs gate, which is seen as a solid line, should ideally begin rising at the exact same time as the voltage $V_{GS,M}$ at the gate of the primary FET, depicted here as a triple-dashed line has reached near its peak.

However, the approximated signal $V_{GS,RC(t)}$ depicted as the gently rising double dashed line, has an RC delay which must be sufficiently long such that the boot-FET signal does not reach a turn-on threshold until the primary FET has fully turned ON. To do otherwise would risk the shoot-through condition depicted in FIG. 22. This reduced slope continues for the remaining rise time, with $M_{boot}$ not reaching its minimum $R_{ds-on}$ until much later, which is beyond the scale of FIG. 5.

Ideally, the boot-FET, $M_{boot}$, will be driven with a gate signal that turns on sharply and as soon as possible, as is depicted by this solid line in FIG. 5. By implementing this well controlled and sharp gate-drive signal, the conduction duration of $M_{boot}$ is maximized and minimum $R_{dson}$ is expressed for as long as is possible. Both of these effects serve to reduce voltage droop even further.

Referring back to FIG. 4 and FIG. 5 it will be noted that this more ideal bootstrap signal can be generated by making minor modifications to the classic non-overlapping clock generator depicted in FIG. 6. This circuit is commonly used within fully integrated half-bridge gate-drivers to produce well-controlled deadtime intervals.

Accordingly, FIG. 7 illustrated a circuit for a small daughterboard board that leverages the internal deadtime circuitry of an existing dual gate-driver, depicted here as U2 104, along with a buffered signal inverter U1 122. The resulting example is a very small driver board that is amenable to complete integration using existing Integrated Circuit (IC) technologies. Referring also to this figure two discrete tuning resistors 102a, 102b are utilized to precisely set the delays between pairs of rising and falling edges with precision.

The components used in this prototype example are listed in TABLE 1. These daughterboards were then used to construct the aforementioned FCML converter proof of concept with full synchronous bootstrapping capability.

7. Bi-Directional Charge Flow

With the foregoing background in mind, the following section introduces a new technology which we call "bi-directional charge flow".

Figure 26:
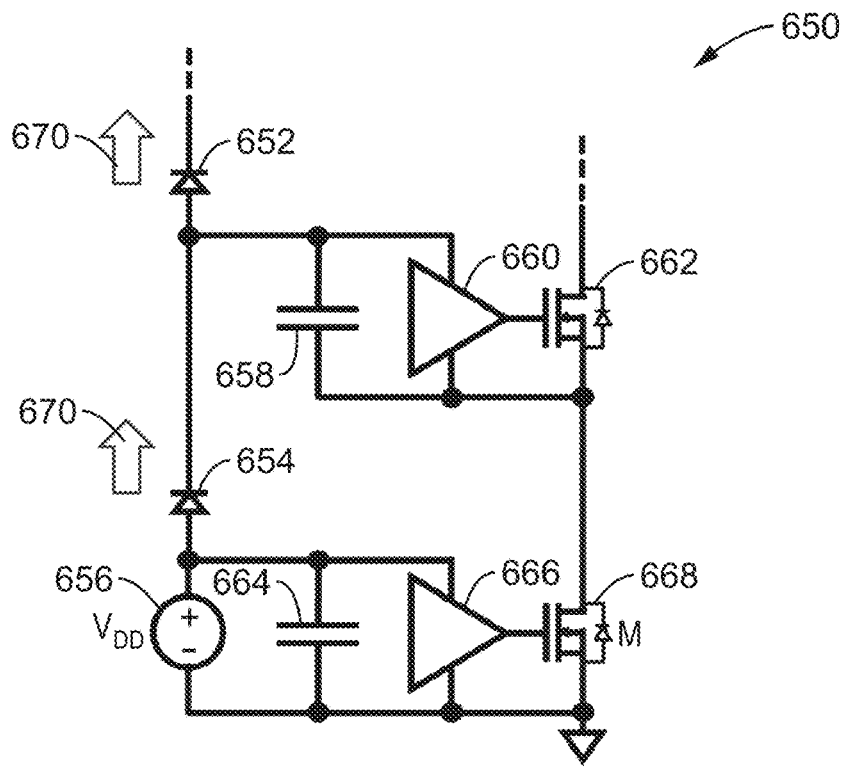
FIG. 26 is a schematic of a conventional diode-based cascaded bootstrap highlighting energy flow in a strictly ascending voltage direction.

FIG. 26 illustrates an example 650 of a diode-based cascaded bootstrap, described earlier having a $V_{DD}$ 656 above which are diodes 654, 652, reaching each stage shown with a capacitor 664, 658, and gate driver 666, 660, each driving a FET 668, 662. In this case, charge can only flow in one direction 670. That is, in the circuit shown, charge must flow in an upward direction from one gate driver to the next.

Figure 27:
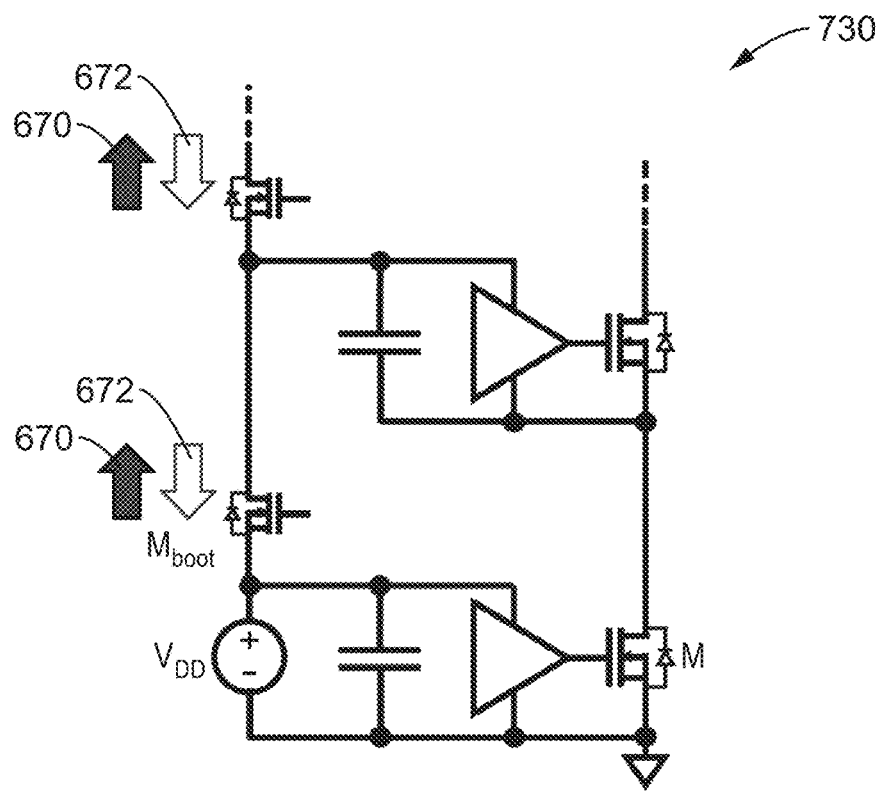
FIG. 27 is a schematic of using synchronous boot-strapping transistors and allowing charge flow in both upward and downward directions, according to at least one embodiment of the present disclosure.
Figure 28:
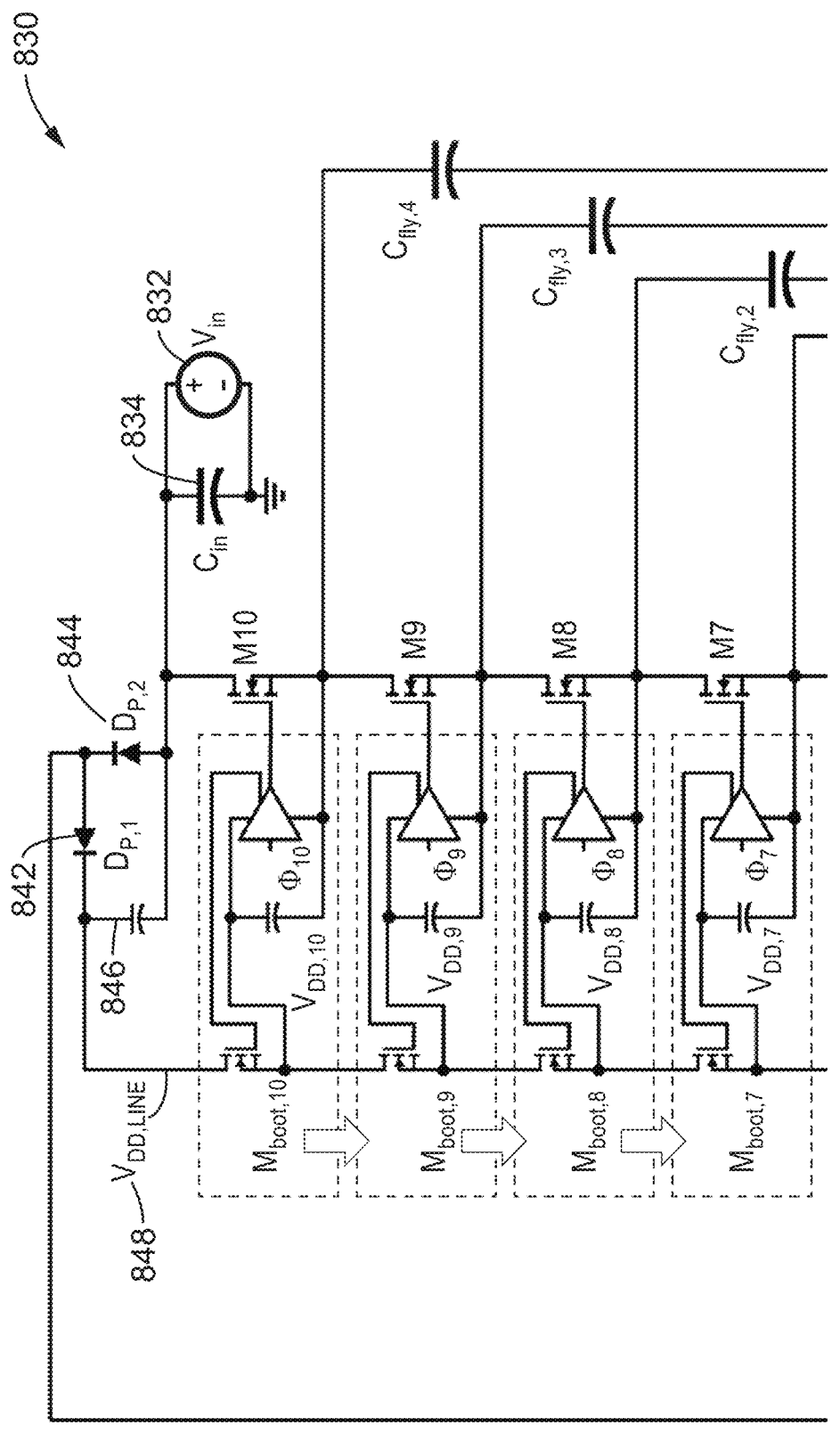
FIG. 28 through FIG. 29 is a schematic of a circuit performing bi-directional synchronous bootstrapping, according to at least one embodiment of the present disclosure.
Figure 29:
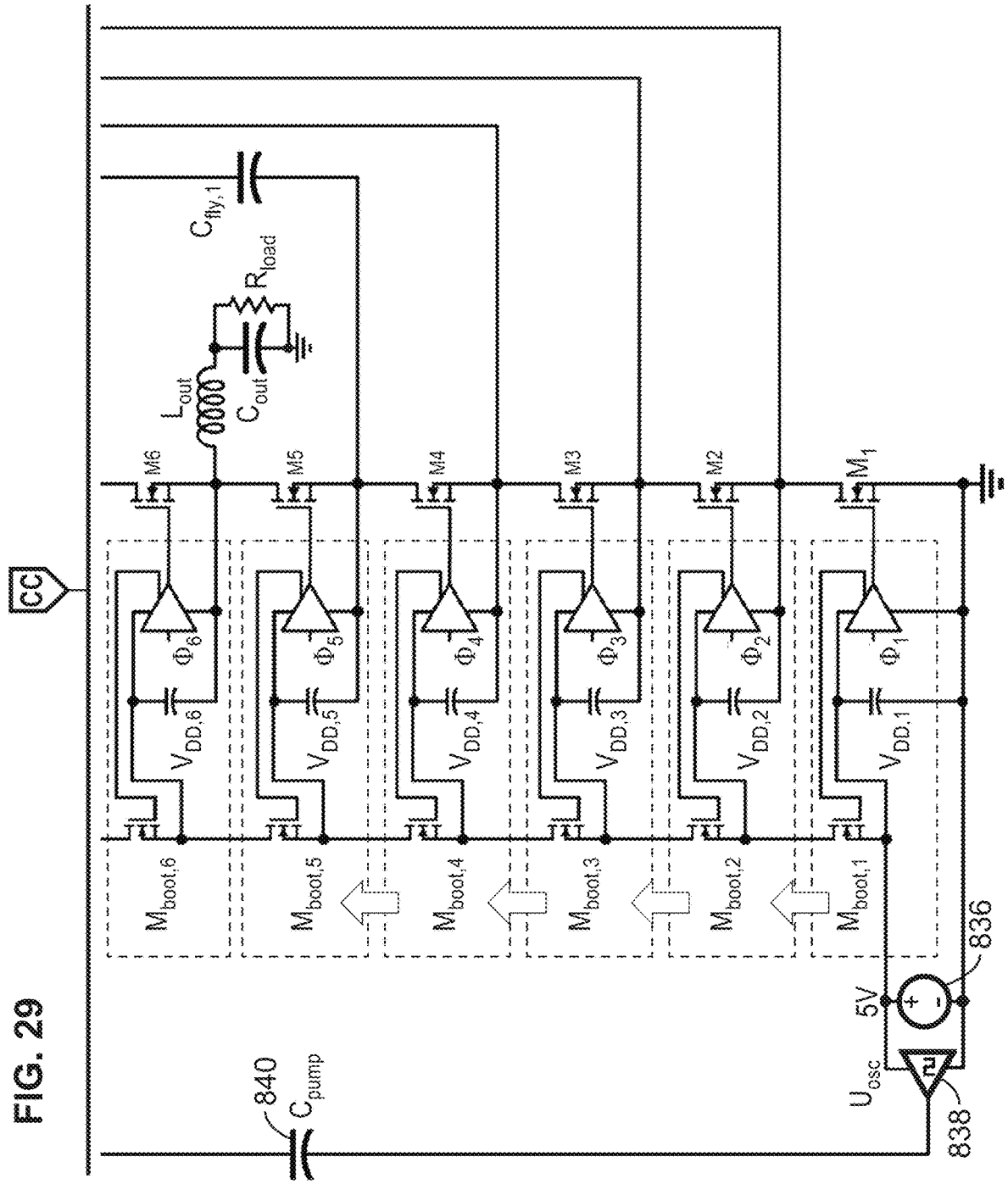

FIG. 27 illustrates an example embodiment 730 of using synchronous boot-strapping transistors in place of diodes, whereby charge can flow both in the upward 670 and downward 672 directions as illustrated on the left side of this figure and the following FIG. 28 through FIG. 29. Since transistors can conduct charge in either direction, dissimilar to diodes, charge can also flow in a negative direction from a high-side driver to the driver that is situated beneath it.

FIG. 28 through FIG. 29 illustrate an example embodiment 830 of a circuit performing bi-directional synchronous bootstrapping. The input voltage 832 and input capacitance 834 is shown connecting to the primary switching devices M10 through M1. In at least one embodiment it was chosen to include a small charge pump which produces a 5V supply that is referenced to the high-side input line voltage labelled $V_{DD,line}$. A 5V source 836 is modulated by an oscillator 838, with this power signal passing pump capacitor 840 and is rectified by diodes $D_{P,1}$ 842 and $D_{P,2}$, 844 and stored on capacitor 846 as voltage labelled $V_{DD,line}$ 848.

In this case, charge can still be delivered upwards through the chain, as per conventional devices. However, charge can now also be supplied from the high side of the bootstrapping network from this $V_{DD,line}$ 848. This serves to significantly decrease the impedance of the bootstrapping network, because the path length of the chain has been approximately halved. As a result, voltage droop is decreased even further.

Figure 30:
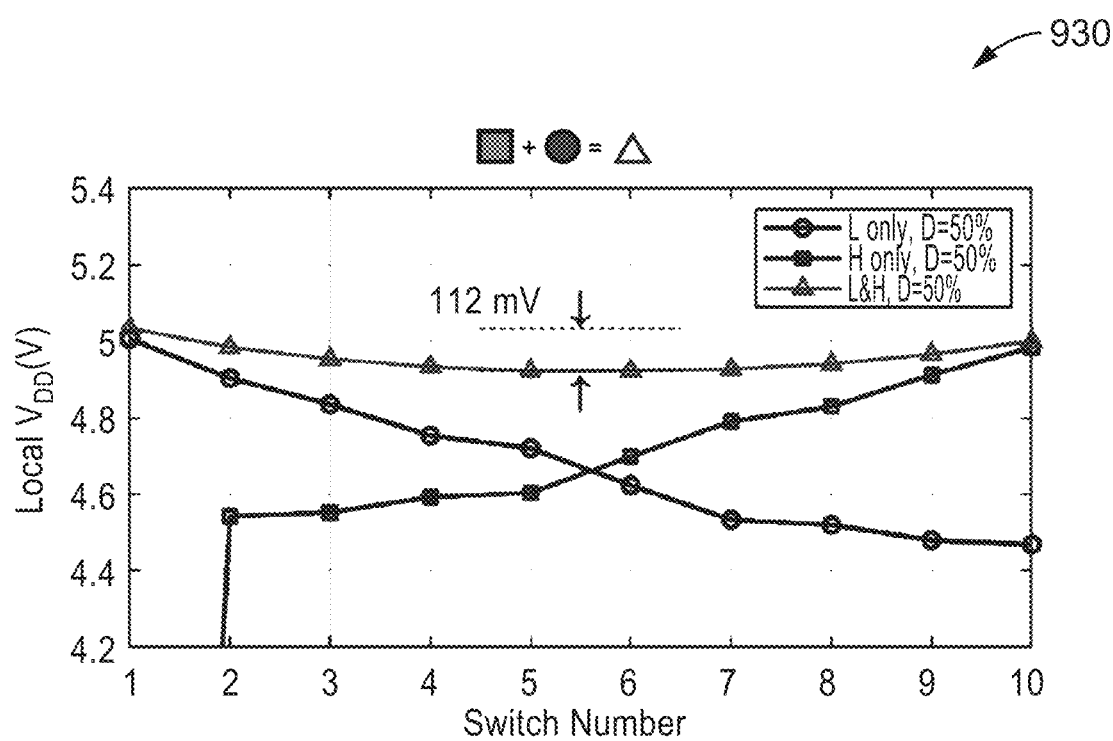
FIG. 30 through FIG. 32 are plots of measured gate drive supply voltages when power is delivered either from a ground-referenced supply, a line-referenced supply, or both simultaneously, with each figure showing a different duty cycle, according to at least one embodiment of the present disclosure.
Figure 31:
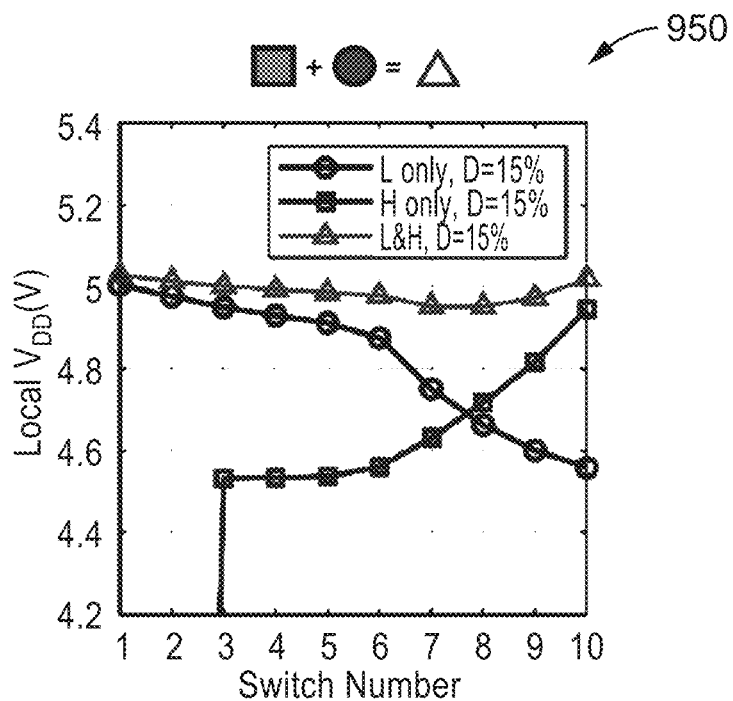
Figure 32:
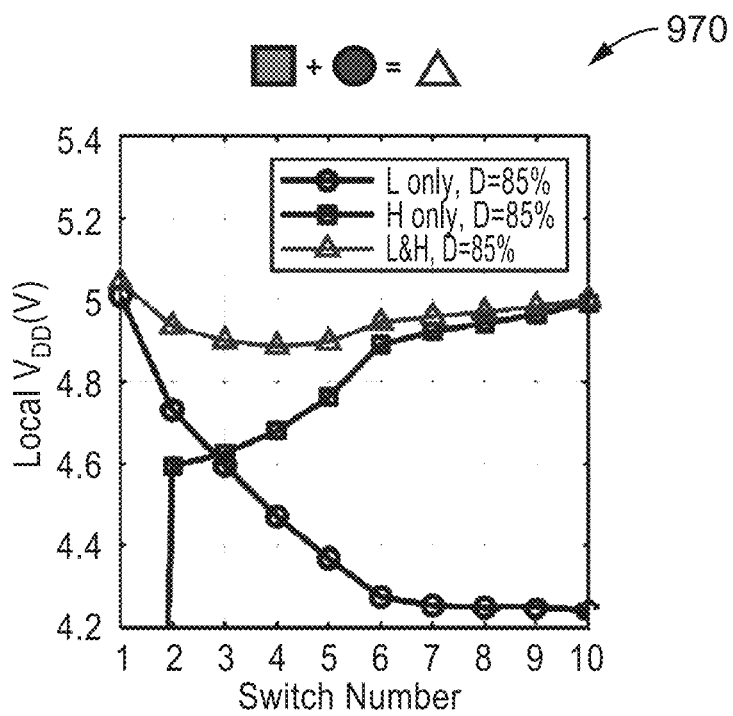

FIG. 30 through FIG. 32 illustrate example results 930, 950 and 970 of measured gate drive supply voltages when power is delivered either from a ground-referenced supply, a line-referenced supply, or both simultaneously for best performance. In FIG. 30 is depicted the voltages across the switches for a converter duty cycle of 50%, and indicates an average maximum voltage deviation of about 100 mV (e.g., 112 mV being the maximum droop) observed across all gate drivers when using present disclosure.

In FIG. 31 and FIG. 32 is the same plot for duty cycles of 15% and 85% respectively. A maximum voltage droop of 160 mV was observed across a wide duty cycle range of 15-85%. As such, the need for local regulation is entirely eliminated, even when using sensitive high tolerance switching devices, such as gallium nitride devices.

To conclude leveraging synchronous bootstrapping methods, the present disclosure develops and demonstrates a bi-directional synchronous technique which is compatible with existing IC technology while delivering significant performance benefits. By maximizing the conduction duration and introducing bi-directional power delivery, voltage droop is made negligible, and the need for local regulation is eliminated, despite operating at very high switching frequencies.

The disclosed gate-drive power delivery solution is suitable for high-order topologies, including, but not limited to, flying-capacitor-multi-level converters. Furthermore, the disclosed approach yields very high gate drive efficiency while significantly improving volume and cost of the converters.

Figure 33:
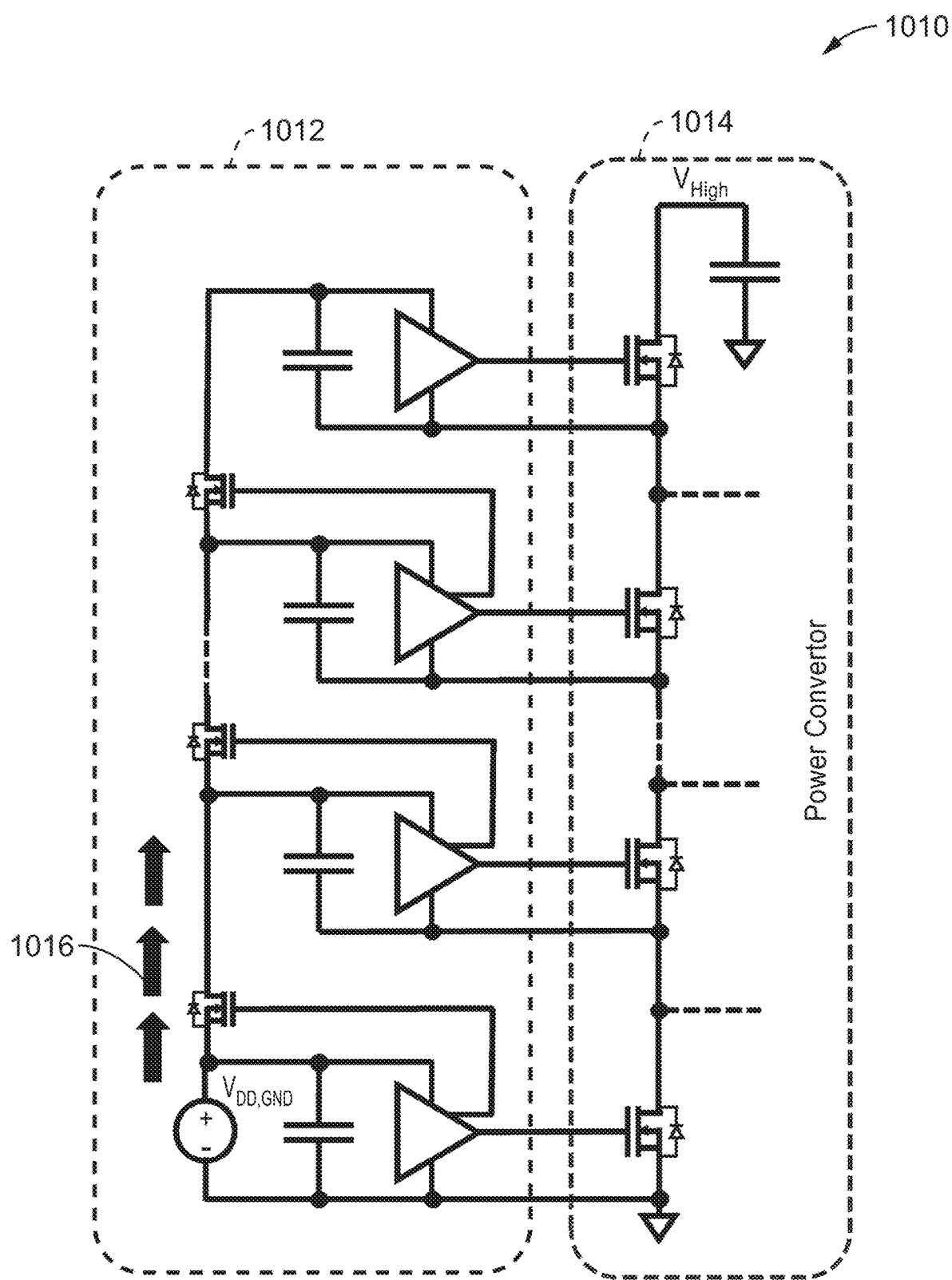
FIG. 33 is a schematic of a synchronous bootstrapping approach depicted with a single voltage supply placed at the lowest potential of the bootstrapping network.

FIG. 33 depicts 1010 a synchronous bootstrapping approach depicted with a single voltage supply 1016 placed at the lowest potential of the bootstrapping network of the driver stages 1012 for the FET switches 1014, wherein all charge is definitively flowing in an upwards direction of increasing voltage potential to subsequent gate drivers.

The bootstrapping scheme of the present disclosure is applicable to any power converter topology in which there is a series chain of power switches, having associated gate-drivers requiring charge to be replenished in order to function. As such, the power converter is depicted as a generalized block with emphasis being placed on the adjacent bootstrapping gate driver power delivery circuitry. It will be noted that in the prior work, charge can only flow through the bootstrapping network to sections biased at equal or higher potential, and so the synchronous bootstrapping networks capability for bi-directional charge conduction cannot be realized.

Figure 34:
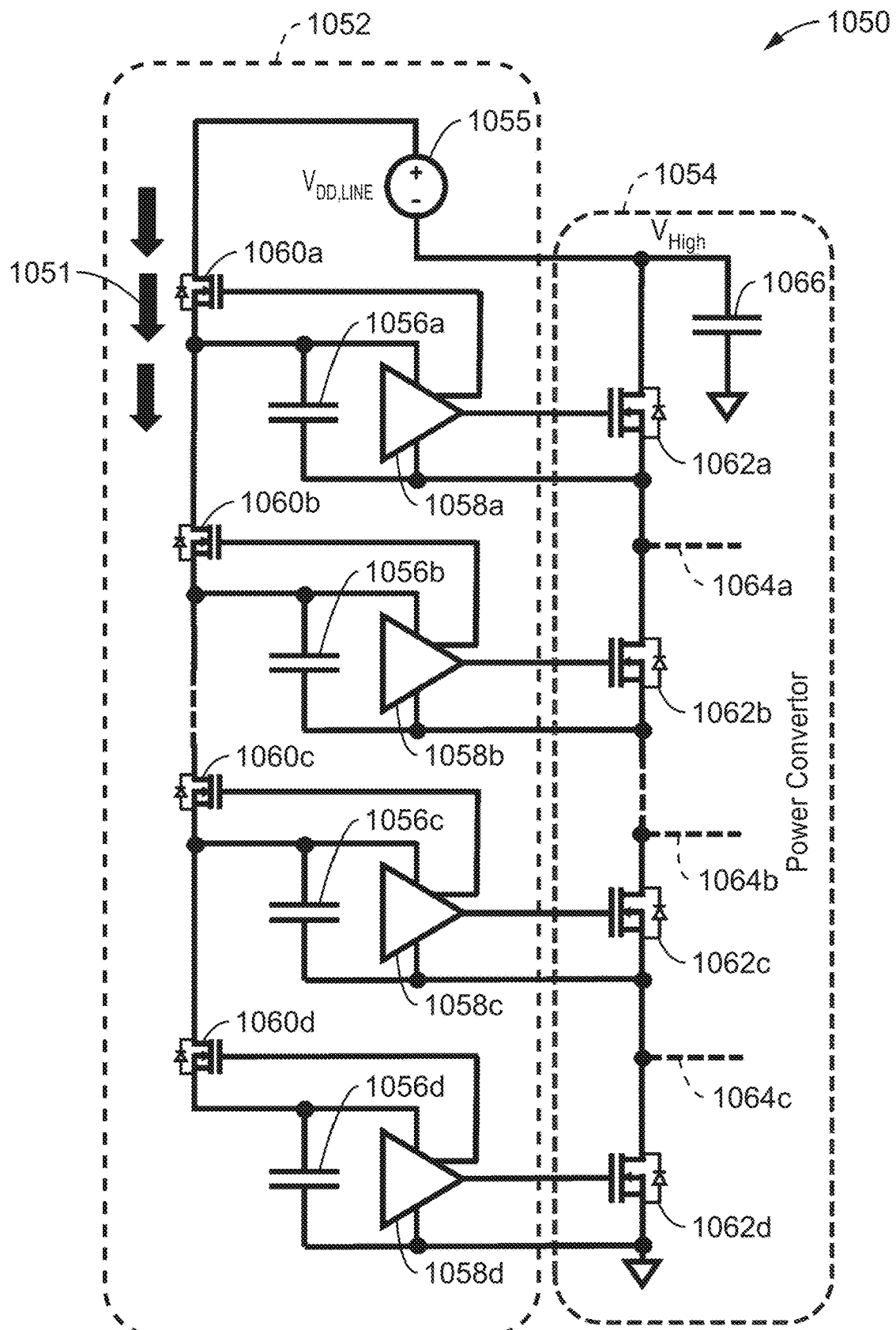
FIG. 34 is a schematic of a cascaded gate driver bootstrapping circuit using a high-side bias voltage to drive current for bootstrapping, according to at least one embodiment of the present disclosure.
Figure 35:
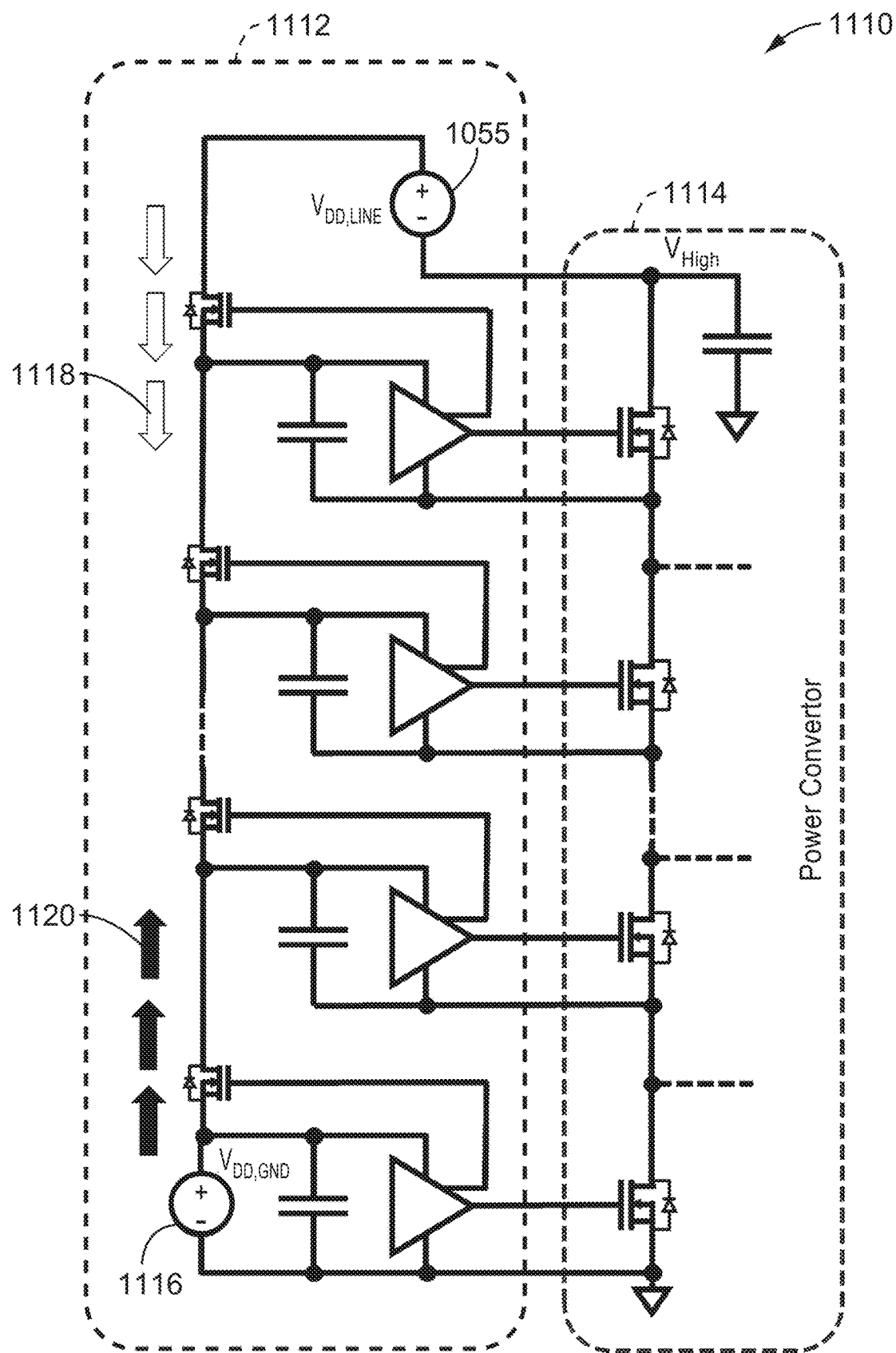
FIG. 35 is a schematic of a cascaded gate driver bootstrapping circuit utilizing both a high-side bias supply and a standard ground referenced bootstrap supply, according to at least one embodiment of the present disclosure.

FIG. 34 through FIG. 36 illustrate example embodiments 1050, 1110 and 1150 of power delivery to the bootstrap stages. These embodiments can facilitate significant improvement over previous systems. These figures emphasize placement of a bias voltage supply at locations distinctly different than that being ground referenced.

In FIG. 34 is seen a cascaded gate driver 1052 which delivers power to each of the gate drivers for a series connected chain of switching devices, 1062a through 1062d, using a high-side bias voltage 1055 to drive current 1051 for bootstrapping. Otherwise, the figure depicts a similar structure with capacitors 1056a through 1056d coupled to gate drivers 1058a through 1058d which respectively control a series of $M_{boot}$ FETs 1060a through 1060d, as well as the primary FETs 1062a through 1062d, with outputs 1064a through 1064d, with a high side capacitance 1066.

It will be noted in the figure that the bias supply voltage is created so as to be biased relative to the high-side line voltage of the power converter. In this way, in combination with a synchronous bootstrapping network, charge can now flow in a downwards direction through the bootstrapping network, delivering charge to gate drivers biased at a lower voltage potential. This high-side referenced bias supply voltage may be created in a number of ways, including charge-pumping from a different bias point, use of a fully isolated power supply, harvesting from existing voltage potentials within the power converter, electrostatic generation, electric battery, etc.

FIG. 35 illustrates an example embodiment 1110 of a cascaded gate driver bootstrapping circuit utilizing a high-side bias supply voltage used in conjunction with a standard ground referenced bootstrap supply. The elements of the driver section 1112 and switching section 1114 are the same as shown in FIG. 34, except for the addition of the low-side bias supply 1116. The bias is thus supplied from both low side 1120 and from high side 1118.

This approach has been demonstrated in hardware, with the combination of multiple charge injection sites, including the high-side line referenced supply, results in greatly improved overall power delivery performance, significantly expanding on previous state of the art solutions.

FIG. 36 illustrates an example embodiment 1150 of a cascaded gate driver bootstrapping circuit in which charge can be injected into the synchronous bootstrapping network from a number of different sites, including intermediary points part-way through the bootstrapping network. The elements of the driver section 1152 and switching section 1154 are the same as shown in FIG. 35, except there is a low-side bias source 1156, at least one intermediate bias source 1158, and a high-side bias source 1160.

As a result of this structure the synchronous bootstrapping transistors 1162a through 1162d are enabled to conduct charge from these intermediary injection sites in both directions 1164, 1166, reducing the charge flow path length and further improving power delivery to the gate drivers within the bootstrapping network.

From the description herein, it will be appreciated that the present disclosure encompasses multiple implementations of the technology which include, but are not limited to, the following:

Embodiments of the present technology may be described herein with reference to flowchart illustrations of methods and systems according to embodiments of the technology, and/or procedures, algorithms, steps, operations, formulae, or other computational depictions, which may also be implemented as computer program products. In this regard, each block or step of a flowchart, and combinations of blocks (and/or steps) in a flowchart, as well as any procedure, algorithm, step, operation, formula, or computational depiction can be implemented by various means, such as hardware, firmware, and/or software including one or more computer program instructions embodied in computer-readable program code. As will be appreciated, any such computer program instructions may be executed by one or more computer processors, including without limitation a general purpose computer or special purpose computer, or other programmable processing apparatus to produce a machine, such that the computer program instructions which execute on the computer processor(s) or other programmable processing apparatus create means for implementing the function(s) specified.

Accordingly, blocks of the flowcharts, and procedures, algorithms, steps, operations, formulae, or computational depictions described herein support combinations of means for performing the specified function(s), combinations of steps for performing the specified function(s), and computer program instructions, such as embodied in computer-readable program code logic means, for performing the specified function(s). It will also be understood that each block of the flowchart illustrations, as well as any procedures, algorithms, steps, operations, formulae, or computational depictions and combinations thereof described herein, can be implemented by special purpose hardware-based computer systems which perform the specified function(s) or step(s), or combinations of special purpose hardware and computer-readable program code.

Furthermore, these computer program instructions, such as embodied in computer-readable program code, may also be stored in one or more computer-readable memory or memory devices that can direct a computer processor or other programmable processing apparatus to function in a particular manner, such that the instructions stored in the computer-readable memory or memory devices produce an article of manufacture including instruction means which implement the function specified in the block(s) of the flowchart(s). The computer program instructions may also be executed by a computer processor or other programmable processing apparatus to cause a series of operational steps to be performed on the computer processor or other programmable processing apparatus to produce a computer-implemented process such that the instructions which execute on the computer processor or other programmable processing apparatus provide steps for implementing the functions specified in the block(s) of the flowchart(s), procedure (s) algorithm(s), step(s), operation(s), formula(e), or computational depiction(s).

It will further be appreciated that the terms "programming" or "program executable" as used herein refer to one or more instructions that can be executed by one or more computer processors to perform one or more functions as described herein. The instructions can be embodied in software, in firmware, or in a combination of software and firmware. The instructions can be stored local to the device in non-transitory media, or can be stored remotely such as on a server, or all or a portion of the instructions can be stored locally and remotely. Instructions stored remotely can be downloaded (pushed) to the device by user initiation, or automatically based on one or more factors.

It will further be appreciated that as used herein, that the terms processor, hardware processor, computer processor, central processing unit (CPU), and computer are used synonymously to denote a device capable of executing the instructions and communicating with input/output interfaces and/or peripheral devices, and that the terms processor, hardware processor, computer processor, CPU, and computer are intended to encompass single or multiple devices, single core and multicore devices, and variations thereof.

From the description herein, it will be appreciated that the present disclosure encompasses multiple implementations of the technology which include, but are not limited to, the following:

A cascaded bootstrapping network, comprising: (a) a plurality of cascaded gate drivers between a high-side and a low-side of the cascaded bootstrapping network; (b) wherein said plurality of gate drivers comprises a plurality of bidirectional active switches configured for synchronous bootstrapping; (c) a low-side ground-referenced bias voltage supply for upward charge flow to the gate drivers; and (d) a high-side bias voltage supply configured for enabling additional injection of charge into the bootstrapping network, including high-side to low-side downward charge so that said bootstrapping network is configured for bidirectional charge flow to the gate drivers, and wherein balanced delivery of charge is maintained.

A switching power conversion apparatus, comprising: (a) a cascaded bootstrapping network having a plurality of cascaded gate drivers between a high-side and a low-side of the network; (b) a plurality of power switches on the output side of a power conversion apparatus, wherein each of said switches is controlled by one gate driver of said plurality of cascaded gate drivers; (c) wherein said plurality of gate drivers comprises a plurality of bidirectional active switches configured for synchronous bootstrapping; (d) a low-side ground-referenced bias voltage supply for upward charge flow to the gate drivers; and (e) a high-side bias voltage supply configured for enabling additional injection of charge into the bootstrapping network, including high-side to low-side downward charge so that said bootstrapping network is configured for bidirectional charge flow to the gate drivers, and wherein balanced delivery of charge is maintained.

A method of providing bidirectional charge flow in a cascaded bootstrapping network, comprising: (a) connecting a plurality of gate drivers into a cascaded bootstrapping network between a high-side and a low-side of the cascaded bootstrapping network; (b) configuring the bootstrapping network for synchronous bootstrapping in which said plurality of gate drivers include a plurality of bidirectional active switches on a bootstrapping path; (c) a low-side ground-referenced bias voltage supply for upward charge flow on said bootstrapping path to the gate drivers; and (d) a high-side bias voltage supply configured for enabling additional injection of charge into the bootstrapping network, including high-side to low-side downward charge on the bootstrapping path so that said bootstrapping network is configured for bidirectional charge flow to the gate drivers, and wherein balanced delivery of charge is maintained.

A cascaded bootstrapping network apparatus having a plurality of cascaded gate drivers between a high side and a low side of the network, and a low side ground-referenced voltage supply for upward charge flow to the gate drivers, the improvement comprising: the plurality of gate drivers comprising a plurality of bidirectional active switches configured for synchronous bootstrapping; and a high side bias voltage supply configured for enabling additional injection of charge into the bootstrapping network, including high side to low side downward charge, wherein the bootstrapping network is thereby configured for bidirectional charge flow to the gate drivers, and wherein balanced delivery of charge is maintained.

A cascaded bootstrapping network apparatus, comprising: a plurality of cascaded gates; a plurality of cascaded gate drivers between a high side and a low side of the network, and a low side ground-referenced voltage supply for upward charge flow to the gate drivers; the plurality of gate drivers comprising a plurality of bidirectional active switches configured for synchronous bootstrapping; and a high side bias voltage supply configured for enabling additional injection of charge into the bootstrapping network, including high side to low side downward charge flow through the bootstrapping network, wherein the bootstrapping network is thereby configured for bidirectional charge flow to the gate drivers, and wherein balanced delivery of charge is maintained.

A method of providing bidirectional charge flow in a cascaded bootstrapping network having a plurality of cascaded gate drivers between a high side and a low side of the network, and a low side ground-referenced voltage supply for upward charge flow to the gate drivers, the method comprising: providing a plurality of bidirectional active switches configured for synchronous bootstrapping as the plurality of gate drivers; and providing a high side bias voltage supply configured for enabling additional injection of charge into the bootstrapping network, including high side to low side downward charge flow through the bootstrapping network, wherein the bootstrapping network is thereby configured for bidirectional charge flow to the gate drivers, and wherein balanced delivery of charge is maintained.

The apparatus or method of any preceding implementation, wherein the high-side bias voltage supply is line-referenced and provides charge to the bootstrapping network in a downward flowing direction.

The apparatus or method of any preceding implementation, wherein said high-side bias voltage supply comprises a fully isolated high-side power supply.

The apparatus or method of any preceding implementation, wherein said high-side bias voltage supply comprises a charge pump that is referenced to a voltage supply at the high-side of the bootstrapping network.

The apparatus or method of any preceding implementation, further comprising one or more intermediate bias voltage supplies referenced to one or more intermediary points within the bootstrapping network for providing charge to the bootstrapping network in both an upward and downward flowing direction.

The apparatus or method of any preceding implementation, wherein each of said one or more intermediate bias voltage supplies comprises a charge pump that is referenced to an intermediary voltage within the bootstrapping network.

The apparatus or method of any preceding implementation, wherein said active switches comprise transistors.

The apparatus or method of any preceding implementation, wherein said active switches comprise bi-directional transistors.

The apparatus or method of any preceding implementation, wherein each of said gate drivers is configured for controlling the switching of a primary power switch on a cascaded power output section.

The apparatus or method of any preceding implementation, wherein the bias voltage supply is line-referenced and provides charge to the bootstrapping network in a downward flowing direction.

The apparatus or method of any preceding implementation, wherein the bias voltage supply is referenced to an intermediary point within the bootstrapping network and provides charge to the bootstrapping network in both an upward and downward flowing direction.

The apparatus or method of any preceding implementation, wherein the bias voltage supply comprises a fully isolated high slide power supply.

The apparatus or method of any preceding implementation, wherein the bias voltage supply comprises a charge pump that is referenced to a voltage supply at the high side of the bootstrapping network.

The apparatus or method of any preceding implementation, wherein the bias voltage supply comprises a charge pump that is referenced to an intermediary voltage within the bootstrapping network.

The apparatus or method of any preceding implementation, wherein the active switches comprise transistors.

As used herein, term "implementation" is intended to include, without limitation, embodiments, examples, or other forms of practicing the technology described herein.

As used herein, the singular terms "a," "an," and "the" may include plural referents unless the context clearly dictates otherwise. Reference to an object in the singular is not intended to mean "one and only one" unless explicitly so stated, but rather "one or more."

Phrasing constructs, such as "A, B and/or C", within the present disclosure describe where either A, B, or C can be present, or any combination of items A, B and C. Phrasing constructs indicating, such as "at least one of" followed by listing a group of elements, indicates that at least one of these group elements is present, which includes any possible combination of the listed elements as applicable.

References in this disclosure referring to "an embodiment", "at least one embodiment" or similar embodiment wording indicates that a particular feature, structure, or characteristic described in connection with a described embodiment is included in at least one embodiment of the present disclosure. Thus, these various embodiment phrases are not necessarily all referring to the same embodiment, or to a specific embodiment which differs from all the other embodiments being described. The embodiment phrasing should be construed to mean that the particular features, structures, or characteristics of a given embodiment may be combined in any suitable manner in one or more embodiments of the disclosed apparatus, system or method.

As used herein, the term "set" refers to a collection of one or more objects. Thus, for example, a set of objects can include a single object or multiple objects.

Relational terms such as first and second, top and bottom, upper and lower, left and right, and the like may be used solely to distinguish one entity or action from another entity or action without necessarily requiring or implying any actual such relationship or order between such entities or actions.

The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element.

As used herein, the terms "approximately", "approximate", "substantially", "essentially", and "about", or any other version thereof, are used to describe and account for small variations. When used in conjunction with an event or circumstance, the terms can refer to instances in which the event or circumstance occurs precisely as well as instances in which the event or circumstance occurs to a close approximation. When used in conjunction with a numerical value, the terms can refer to a range of variation of less than or equal to +10% of that numerical value, such as less than or equal to +5%, less than or equal to +4%, less than or equal to +3%, less than or equal to +2%, less than or equal to +1%, less than or equal to +0.5%, less than or equal to +0.1%, or less than or equal to +0.05%. For example, "substantially" aligned can refer to a range of angular variation of less than or equal to +10°, such as less than or equal to +5°, less than or equal to +4°, less than or equal to +3°, less than or equal to +2°, less than or equal to +1°, less than or equal to +0.5°, less than or equal to +0.1°, or less than or equal to +0.05°.

Additionally, amounts, ratios, and other numerical values may sometimes be presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

The term "coupled" as used herein is defined as connected, although not necessarily directly and not necessarily mechanically. A device or structure that is "configured" in a certain way is configured in at least that way, but may also be configured in ways that are not listed.

Benefits, advantages, solutions to problems, and any element(s) that may cause any benefit, advantage, or solution to occur or become more pronounced are not to be construed as a critical, required, or essential features or elements of the technology describes herein or any or all the claims.

In addition, in the foregoing disclosure various features may be grouped together in various embodiments for the purpose of streamlining the disclosure. This method of disclosure is not to be interpreted as reflecting an intention that the claimed embodiments require more features than are expressly recited in each claim. Inventive subject matter can lie in less than all features of a single disclosed embodiment.

The abstract of the disclosure is provided to allow the reader to quickly ascertain the nature of the technical disclosure. It is submitted with the understanding that it will not be used to interpret or limit the scope or meaning of the claims.

It will be appreciated that the practice of some jurisdictions may require deletion of one or more portions of the disclosure after that application is filed. Accordingly, the reader should consult the application as filed for the original content of the disclosure. Any deletion of content of the disclosure should not be construed as a disclaimer, forfeiture or dedication to the public of any subject matter of the application as originally filed.

The following claims are hereby incorporated into the disclosure, with each claim standing on its own as a separately claimed subject matter.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

All structural and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

TABLE 1

Daughterboard Components

| Component | Description |
|---|---|
| $U_1$ | Gate Driver, LMG1020 |
| $U_2$ | Dual Gate Driver, PE29102 |
| $M_{boot}$ | 100 V 73 mΩ, EPC2036 |
| $R_s$ | 200 Ω (0201) |
| $C_s$ | 50 pF (0201) |
| $R_{HL}$ | 100 kΩ (0201) |
| $R_{LH}$ | 750 kΩ (0201) |
| $D_z$ | 5.6 V Zener (0201) |
| $C_P$ | 10 nF (0201) |
| $R_P$ | 10 Ω (0201) |
| $R_G$ | 5.1 Ω (0201) |
| $C_{BYP}$ | 0.1 μF (0201), 2.2 μF (0402) |

Note:
0201 and 0402 are package size designators

TABLE 2

FCML Components

| Component | Description |
|---|---|
| $L_{out}$ | 7.92 μH, 11A, 10.8 mΩ |
| $M_{1-10}$ | 100 V 3.2 mΩ, EPC2218 |
| $C_{fly, 1, 2, 3, 4}$ | 3.2 μF, 4.2 μF, 3.6 μF, 3.2 μFF, X7R |
| $C_{in}$ | 4.2 μF, X7R |
| Level Shift | 2EDF7275K |
| $U_{osc}$ | Gate Driver, 1EDN7550U |
| $D_{p1, 2}$ | 20 V Schottky 0402 |
| $C_{pump}$ | 47 nF 450 V X7T 0805 |

Note:
0402 and 0805 are package size designators

What is claimed is:

1. A cascaded bootstrapping network, comprising:
   a plurality of cascaded gate drivers between a high-side and a low-side of the cascaded bootstrapping network;
   wherein said plurality of gate drivers comprises a plurality of bidirectional active switches configured for synchronous bootstrapping;
   a low-side ground-referenced bias voltage supply for upward charge flow to the gate drivers; and
   a high-side bias voltage supply configured for enabling additional injection of charge into the bootstrapping network, including high-side to low-side downward charge so that said bootstrapping network is configured for bidirectional charge flow to the gate drivers, and wherein balanced delivery of charge is maintained.

2. The apparatus of claim 1, wherein the high-side bias voltage supply is line-referenced and provides charge to the bootstrapping network in a downward flowing direction.

3. The apparatus of claim 1, wherein said high-side bias voltage supply comprises a fully isolated high-side power supply.

4. The apparatus of claim 3, wherein said high-side bias voltage supply comprises a charge pump that is referenced to a voltage supply at the high-side of the bootstrapping network.

5. The apparatus of claim 1, further comprising one or more intermediate bias voltage supplies referenced to one or more intermediary points within the bootstrapping network for providing charge to the bootstrapping network in both an upward and downward flowing direction.

6. The apparatus of claim 5, wherein each of said one or more intermediate bias voltage supplies comprises a charge pump that is referenced to an intermediary voltage within the bootstrapping network.

7. The apparatus of claim 1, wherein said active switches comprise transistors.

8. The apparatus of claim 7, wherein said active switches comprise bi-directional transistors.

9. The apparatus of claim 1, wherein each of said gate drivers is configured for controlling the switching of a primary power switch on a cascaded power output section.

10. A switching power conversion apparatus, comprising:
a cascaded bootstrapping network having a plurality of cascaded gate drivers between a high-side and a low-side of the network;
a plurality of power switches on the output side of a power conversion apparatus, wherein each of said switches is controlled by one gate driver of said plurality of cascaded gate drivers;
wherein said plurality of gate drivers comprises a plurality of bidirectional active switches configured for synchronous bootstrapping;
a low-side ground-referenced bias voltage supply for upward charge flow to the gate drivers; and
a high-side bias voltage supply configured for enabling additional injection of charge into the bootstrapping network, including high-side to low-side downward charge so that said bootstrapping network is configured for bidirectional charge flow to the gate drivers, and wherein balanced delivery of charge is maintained.

11. The apparatus of claim 10, wherein the high-side bias voltage supply is line-referenced and provides charge to the bootstrapping network in a downward flowing direction.

12. The apparatus of claim 10, wherein said high-side bias voltage supply comprises a fully isolated high-side power supply.

13. The apparatus of claim 12, wherein said high-side bias voltage supply comprises a charge pump that is referenced to a voltage supply at the high-side of the bootstrapping network.

14. The apparatus of claim 10, further comprising one or more intermediate bias voltage supplies referenced to one or more intermediary points within the bootstrapping network for providing charge to the bootstrapping network in both an upward and downward flowing direction.

15. The apparatus of claim 14, wherein each of said one or more intermediate bias voltage supplies comprises a charge pump that is referenced to an intermediary voltage within the bootstrapping network.

16. The apparatus of claim 10, wherein said active switches comprise transistors.

17. The apparatus of claim 16, wherein said active switches comprise bi-directional transistors.

18. A method of providing bidirectional charge flow in a cascaded bootstrapping network, comprising:
connecting a plurality of gate drivers into a cascaded bootstrapping network between a high-side and a low-side of the cascaded bootstrapping network;
configuring the bootstrapping network for synchronous bootstrapping in which said plurality of gate drivers include a plurality of bidirectional active switches on a bootstrapping path;
a low-side ground-referenced bias voltage supply for upward charge flow on said bootstrapping path to the gate drivers; and
a high-side bias voltage supply configured for enabling additional injection of charge into the bootstrapping network, including high-side to low-side downward charge on the bootstrapping path so that said bootstrapping network is configured for bidirectional charge flow to the gate drivers, and wherein balanced delivery of charge is maintained.

* * * * *